US012720762B2

(12) United States Patent
Chen et al.

(10) Patent No.: US 12,720,762 B2
(45) Date of Patent: Aug. 25, 2026

(54) FERROELECTRIC MEMORY DEVICE COMPRISING A CHIMNEY SEED STRUCTURE AND METHOD FOR FORMING THE SAME

(71) Applicant: Taiwan Semiconductor Manufacturing Company, Ltd., Hsinchu (TW)

(72) Inventors: Kuen-Yi Chen, Hsinchu City (TW); Yi-Hsuan Chen, Taoyuan City (TW); Yi Ching Ong, Hsinchu (TW); Kuo-Ching Huang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 479 days.

(21) Appl. No.: 18/316,448

(22) Filed: May 12, 2023

(65) Prior Publication Data

US 2024/0381662 A1 Nov. 14, 2024

(51) Int. Cl.
*H10B 53/30* (2023.01)
*H10B 53/40* (2023.01)

(52) U.S. Cl.
CPC ............. *H10B 53/30* (2023.02); *H10B 53/40* (2023.02)

(58) Field of Classification Search
CPC ................................ H10B 53/30; H10B 53/40
USPC .............................................................. 438/3
See application file for complete search history.

(56) References Cited

U.S. PATENT DOCUMENTS 4,437,139 A * 3/1984 Howard ................... H10D 1/68 204/192.15
10,546,917 B1 * 1/2020 Tsai ....................... H10D 1/042
2006/0141663 A1 * 6/2006 Kim .................... H10W 20/037 438/98
2011/0256715 A1 * 10/2011 Pan ..................... H10W 20/033 438/653
2020/0312950 A1 * 10/2020 Haratipour ............... H01G 4/33
2020/0357927 A1 * 11/2020 Hsieh ................... H10D 64/689
(Continued)

OTHER PUBLICATIONS

Kim et al. "Ferroelectric Hf0.5Zr0.5O2 Thin Films: A Review of Recent Advances" JOM: the journal of the Minerals, Metals & Materials Society, published on Sep. 28, 2018.

*Primary Examiner* — Duy T Nguyen
(74) *Attorney, Agent, or Firm* — Eschweiler & Potashnik, LLC

(57) ABSTRACT

Various embodiments of the present disclosure are directed towards a ferroelectric memory device comprising a chimney seed structure. A ferroelectric layer overlies a bottom electrode layer, and a top electrode layer overlies the ferroelectric layer. The top electrode layer, the ferroelectric layer, and the bottom electrode layer form a plurality of memory cells, and a dielectric wall extends through the top electrode layer and segments the top electrode layer into a plurality top electrodes individual to the memory cells. The chimney seed structure underlies the ferroelectric layer and extends through the bottom electrode layer from the ferroelectric layer. The chimney seed structure is configured to seed ferroelectric crystalline growth in the ferroelectric layer to allow the ferroelectric layer to achieve a large remanent polarization with a small thickness. The small thickness increases read speeds, while the large remanent polarization increases a read window and hence reliability.

20 Claims, 33 Drawing Sheets

(56) References Cited

U.S. PATENT DOCUMENTS

2021/0193811 A1* 6/2021 Moon .................... H10B 12/37
2022/0367493 A1* 11/2022 Lee ........................ H10B 53/30

* cited by examiner

FERROELECTRIC MEMORY DEVICE COMPRISING A CHIMNEY SEED STRUCTURE AND METHOD FOR FORMING THE SAME

BACKGROUND

Many modern-day electronic devices include non-volatile memory. Non-volatile memory is electronic memory that is able to store data in the absence of power. Promising candidates for the next generation of non-volatile memory include ferroelectric memory. Ferroelectric memory has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 22-24, 25A and 25B, 26-29, 30A and 30B to 33A and 33B. 34, and 35 illustrate a series of views of some embodiments of a method for forming a ferroelectric memory device comprising a chimney seed structure.

DETAILED DESCRIPTION

Figure 1:
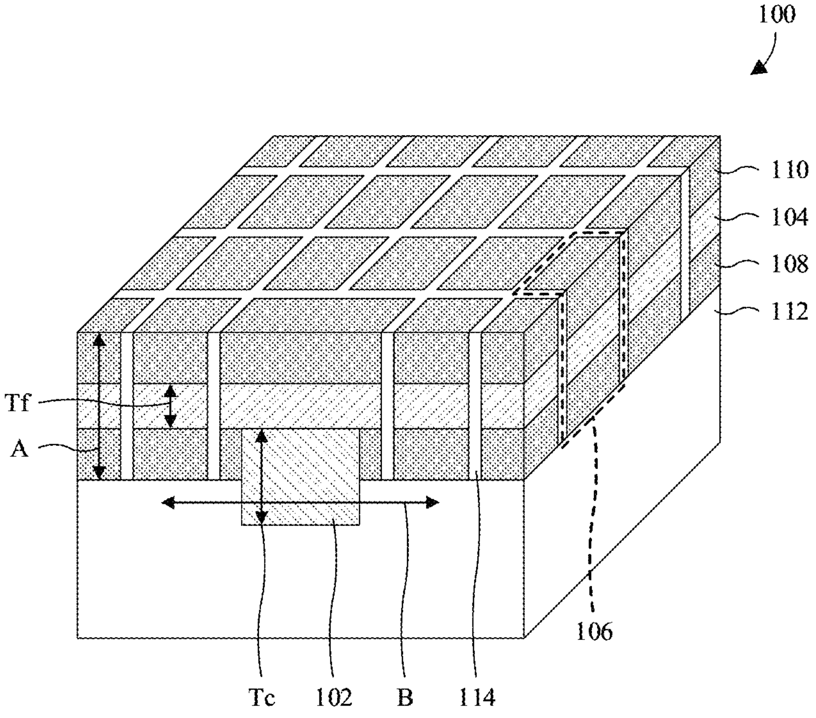
FIG. 1 illustrates a perspective view of some embodiments of a ferroelectric memory device comprising a chimney seed structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric memory device may comprise a ferroelectric tunnel junction (FTJ). The FTJ comprises a bottom electrode, a ferroelectric element overlying the bottom electrode, and a top electrode overlying the ferroelectric element. The ferroelectric element has a remanent polarization that may be used to represent a bit of data. A first state may represent a binary “0”, whereas a second state may represent a binary “1”.

The remanent polarization may be switched between the first and second states by appropriately biasing the bottom and top electrodes. In the first state, the ferroelectric element has a first resistance. In the second state, the ferroelectric element has a second resistance. Therefore, the state of the remanent polarization may be read by appropriately biasing the bottom and top electrodes and comparing a read current tunnelling through the ferroelectric element to a threshold. A first current tunnels through the ferroelectric element when the remanent polarization has the first state, and a second current tunnels through the ferroelectric element when the remanent polarization has the second state. Therefore, a threshold midway between the first and second currents allows the state of the remanent polarization to be read.

As the FTJ is scaled down, read current decreases, thereby decreasing the speed at which the state of the remanent polarization can be sensed (e.g., by a sense amplifier). An approach for increasing the sensing speed is to reduce a thickness of the ferroelectric element, which increases read current. However, as the thickness is decreased, the ferroelectric crystalline phase decreases and hence the remanent polarization decreases. As the remanent polarization decreases, the difference between the first and second resistances decreases and hence the difference between the first and second currents decreases. This, in turn, reduces the so called read window and hence increases the likelihood of data corruption and misreads.

Various embodiments of the present disclosure are directed towards a ferroelectric memory device comprising a chimney seed structure. The chimney seed structure is covered by and directly contacts a ferroelectric layer and is itself ferroelectric. Further, the chimney seed structure has a large thickness relative to the ferroelectric layer. The ferroelectric layer partially forms memory cells, which may, for example, be FTJs or the like.

Growth of a ferroelectric crystalline phase increases generally with ferroelectric thickness and conversely decreases generally with ferroelectric thickness. Because of the large thickness at the chimney seed structure, the chimney seed structure has a large amount of growth of the ferroelectric crystalline phase during manufacture. The ferroelectric crystalline phase grows vertically along a thickness of the chimney seed structure and further grows laterally outward from the chimney seed structure into the ferroelectric layer.

Because the ferroelectric crystalline phase grows into the ferroelectric layer from the chimney seed structure, the chimney seed structure seeds growth of the ferroelectric crystalline phase in the ferroelectric layer and allows the ferroelectric layer to have a large remnant polarization despite a small thickness. Because the ferroelectric layer has a large remnant polarization, the memory cells may have large read windows. Hence, the likelihood of data corruption and misreads is low and reliability is enhanced. Because the ferroelectric layer has the small thickness, the memory cells have large read currents. Hence, remanent polarization states of the memory cells may be quickly read.

Further, because the ferroelectric crystalline phase grows into the ferroelectric layer from the chimney seed structure, ferroelectric thickness at the memory cells is essentially decoupled from growth of the ferroelectric crystalline phase at the memory cells. As such, the ferroelectric memory device may be scaled down more than would otherwise be possible while maintaining good performance and reliable operation.

With reference to FIG. 1, a perspective view 100 of some embodiments of a ferroelectric memory device comprising a chimney seed structure 102 is provided. The ferroelectric memory device may, for example, find application with in-memory computing (IMC), embedded non-volatile memory, and the like.

The chimney seed structure 102 is covered by and directly contacts a ferroelectric layer 104 and is itself ferroelectric. Further, the chimney seed structure 102 has a large thickness relative to the ferroelectric layer 104. Hence, the chimney seed structure 102 may also be regarded as a thick ferroelectric layer, whereas the ferroelectric layer 104 may also be regarded as a thin ferroelectric layer. The ferroelectric layer 104 partially forms a plurality of memory cells 106 around the chimney seed structure 102. The memory cells 106 may, for example, be FTJs or some other suitable type of ferroelectric memory cells.

Growth of a ferroelectric crystalline phase increases generally with ferroelectric thickness and conversely decreases generally with ferroelectric thickness. The ferroelectric crystalline phase may, for example, correspond to the orthorhombic phase or to some other suitable phase. Because of the large thickness, the chimney seed structure 102 has a large amount of growth of the ferroelectric crystalline phase during manufacture. The ferroelectric crystalline phase grows vertically along a thickness of the chimney seed structure 102 and further grows laterally outward from the chimney seed structure 102 into the ferroelectric layer 104. Because of the vertical growth, the chimney seed structure 102 acts as a chimney.

Because the ferroelectric crystalline phase grows into the ferroelectric layer 104 from the chimney seed structure 102, the chimney seed structure 102 seeds ferroelectric crystalline growth at the ferroelectric layer 104. Further, the ferroelectric layer 104 may have a large remnant polarization despite having a small thickness. Because the ferroelectric layer 104 may have a large remnant polarization, the memory cells 106 may have large read windows. Hence, the likelihood of data corruption and misreads is low and reliability is enhanced. Because the ferroelectric layer 104 has the small thickness, the memory cells 106 may have large read currents. Hence, remanent polarization states of the memory cells 106 may be quickly read. For example, a remanent polarization state may be read in less than a microsecond.

Further, because the ferroelectric crystalline phase grows into the ferroelectric layer 104 from the chimney seed structure 102, ferroelectric thickness at the memory cells 106 is essentially decoupled from growth of the ferroelectric crystalline phase at the memory cells 106. As such, the ferroelectric memory device may be scaled down more than would otherwise be possible while maintaining good performance and reliable operation.

With continued reference to FIG. 1, the ferroelectric layer 104 is between and directly contacts a bottom electrode layer 108 and a top electrode layer 110, which both partially form the plurality of memory cells 106. A top of the ferroelectric layer 104 underlies the top electrode layer 110 and is flat throughout. Further, a bottom of the ferroelectric layer 104 overlies the bottom electrode layer 108 and is flat throughout.

The chimney seed structure 102 extends from the bottom of the ferroelectric layer 104, through the bottom electrode layer 108, into a top of an intermetal dielectric (IMD) layer 112. As such, the chimney seed structure 102 is recessed into a top of the IMD layer 112. While illustrated as being separate from the ferroelectric layer 104, the chimney seed structure 102 may alternatively be integrated with and/or part of the ferroelectric layer 104.

A dielectric wall 114 extends through the bottom electrode layer 108, the ferroelectric layer 104, and the top electrode layer 110. The dielectric wall 114 individually surrounds the memory cells 106 and the chimney seed structure 102 to separate the memory cells 106 and the chimney seed structure 102 from each other. Further, the dielectric wall 114 has a grid-shaped top geometry but may have some other suitable top geometry. The dielectric wall 114 may, for example, be or comprise silicon oxide and/or some other suitable dielectric(s).

The memory cells 106 comprise individual top electrodes, ferroelectric elements, and bottom electrodes. The top electrode of each memory cell 106 corresponds to a portion of the top electrode layer 110, and the bottom electrode of each memory cell 106 corresponds to a portion of the bottom electrode layer 108. Further, the ferroelectric element of each memory cell 106 corresponds to a portion of the ferroelectric layer 104.

In some embodiments, the top electrode layer 110 is a pure metal, a refractory metal nitride, a conductive oxide, or some other suitable conductive material. In some embodiments, the bottom electrode layer 108 is a pure metal, a refractory metal nitride, a conductive oxide, or some other suitable conductive material. In some embodiments, the top electrode layer 110 and the bottom electrode layer 108 are the same material. In other embodiments, the top electrode layer 110 and the bottom electrode layer 108 are different materials.

In some embodiments, the top electrode layer 110 is semiconductive, whereas the bottom electrode layer 108 is a pure metal, a refractory metal nitride, a conductive oxide, or some other suitable conductive material. In other embodiments, the bottom electrode layer 108 is semiconductive, whereas the top electrode layer 110 is a pure metal, a refractory metal nitride, a conductive oxide, or some other suitable conductive material. To the extent that an electrode layer amongst the bottom and top electrode layers 108, 110 is semiconductive, the electrode layer may, for example, be or comprise a single or polycrystalline semiconductor material that is N or P doped. The semiconductor material may, for example, be silicon, germanium, indium tin oxide (ITO), or some other suitable semiconductor material. Further, the semiconductor material may, for example, have a bandgap less than about 2 or some other suitable value.

In some embodiments, the bottom electrode layer 108 is nitrogen doped and/or the top electrode layer 110 is nitrogen doped. The nitrogen doping may, for example, have an atomic percentage greater than or equal to about 50%, about 60%, or some other suitable percentage. The nitrogen doping reduces the oxygen scavenge effect, thereby reducing defects and improving electric field uniformity across the ferroelectric layer 104. The oxygen scavenge effect refers to a tendency of an electrode layer to absorb oxygen when heated.

In some embodiments, the memory cells 106 may be regarded as metal-ferroelectric-metal (MFM) memory cells. Such embodiments may arise when the bottom and top electrode layers 108, 110 are metal. Further, in some embodiments, the memory cells 106 may be regarded as metal-ferroelectric-semiconductor (MFS) memory cells or semiconductor-ferroelectric-metal (SFM) memory cells. Such embodiments may arise when the bottom electrode layer 108 is metal, and the top electrode layer 110 is semiconductive, or vice versa.

In some embodiments, the IMD layer 112 is a low k dielectric material with a dielectric constant less about 9, about 3.9, or some other suitable value. In some embodiments, the IMD layer 112 is or comprises silicon nitride (e.g., $Si_3N_4$), silicon carbon nitride (SiCN), silicon oxynitride (SiON), some other suitable dielectric material(s), or any combination of the foregoing. In some embodiments, the IMD layer 112 is nitrogen doped. The nitrogen doping may, for example, have an atomic percentage greater than or equal to about 8%, about 10%, about 15%, or some other suitable percentage. The nitrogen doping lowers surface energy of the chimney seed structure 102 along an interface at which the IMD layer 112 and the chimney seed structure 102 directly contact. This lower surface energy enhanced growth of the ferroelectric crystalline phase and hence enhanced remanent polarization.

In some embodiments, the ferroelectric layer 104 is or comprises perovskite, rutile, an orthorhombic thin film, or some other suitable ferroelectric material. For example, the ferroelectric layer 104 may be or comprise hafnium zirconium oxide or the like. In some embodiments, the ferroelectric layer 104 is nitrogen doped. The nitrogen doping may, for example, have a non-zero atomic percentage of less than or equal to about 5%, 3%, or some other suitable percentage and/or may, for example, have a non-zero atomic percentage of about 0.1-5%, about 0.1-2.5%, about 2.5-5.0%, or some other suitable percentage. The nitrogen doping lowers a bandgap of the ferroelectric layer 104, thereby increasing read current through the memory cells 106. Increased read current leads to faster read times.

In some embodiments, a thickness Tf of the ferroelectric layer 104 is less than or equal to about 4 nanometers, about 2 nanometers, or some other suitable thickness and/or is about 0.1-2 nanometers, about 2-4 nanometers, or some other suitable thickness. If the thickness Tf is too large (e.g., more than 4 nanometers), read current through the memory cells 106 may be small and therefore read speeds may be slow.

In some embodiments, the chimney seed structure 102 is or comprises perovskite, rutile, an orthorhombic thin film, or some other suitable ferroelectric material. For example, the ferroelectric layer 104 may be or comprise hafnium zirconium oxide or the like. In some embodiments, doping aside (e.g., nitrogen doping), the chimney seed structure 102 and the ferroelectric layer 104 are the same ferroelectric material. For example, the ferroelectric layer 104 may be nitrogen doped hafnium zirconium oxide, whereas the chimney seed structure 102 may be hafnium zirconium oxide without nitrogen doping.

In some embodiments, because the chimney seed structure 102 is ferroelectric, the chimney seed structure 102 may also be regarded as a ferroelectric chimney, a ferroelectric chimney structure, a ferroelectric chimney seed structure, or the like. Further, in some embodiments, because the chimney seed structure 102 has a structure resembling an island, the chimney seed structure 102 may also be regarded as an island seed structure, a ferroelectric island, a ferroelectric island structure, or the like.

In some embodiments, a thickness Tc of the chimney seed structure 102 is greater than or equal to about 8 nanometers, about 10 nanometers, or some other suitable thickness and/or is about 8-30 nanometers, about 8-20 nanometers, or some other suitable thickness. If the thickness Tc is too small (e.g., less than 8 nanometers), the ferroelectric crystalline phase may fail to sufficiently grow into the ferroelectric layer 104. As a result, remnant polarization at the memory cells 106 may be low and reliability of the memory cells 106 may be low.

Figure 2:
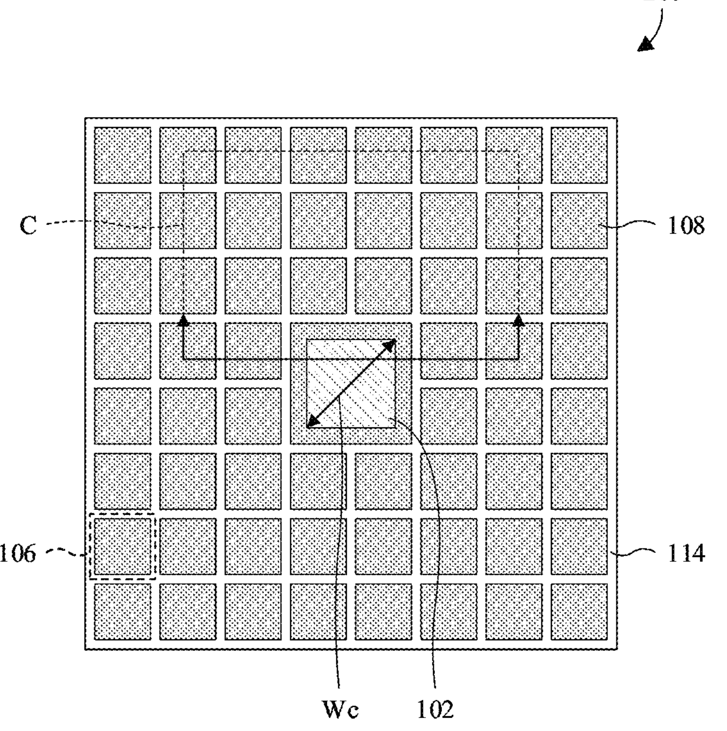
FIG. 2 illustrates a top layout view of some embodiments of the ferroelectric memory device of FIG. 1

With reference to FIG. 2, a top layout view 200 of some embodiments the ferroelectric memory device of FIG. 1 is provided. The perspective view 100 of FIG. 1 may, for example, be take within box C in FIG. 2. The ferroelectric chimney 102 has a square top geometry, but may alternatively have a rectangular top geometry, a circular top geometry, a triangular top geometry, a hexagonal top geometry, or some other suitable top geometry. In some embodiments, a diagonal width Wc of the chimney seed structure 102 is greater than or equal to about 1 micrometer, 2 micrometers, or some other suitable value.

The plurality of memory cells 106 are arranged in a plurality of rows and a plurality of columns around the chimney seed structure 102. During manufacture, the ferroelectric crystalline phase grows laterally outward from the chimney seed structure 102 to the memory cells 106 so remanent polarization is high at the memory cells even with a small ferroelectric thickness. This, in turn, allows enhanced scaling down.

Figure 3A:
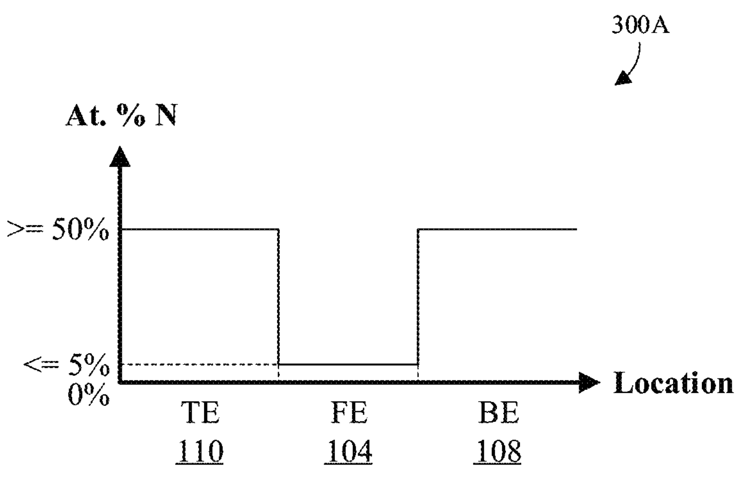
FIGS. 3A and 3B illustrate nitrogen doping profiles of some embodiments of the ferroelectric memory device of FIG. 1.
Figure 3B:
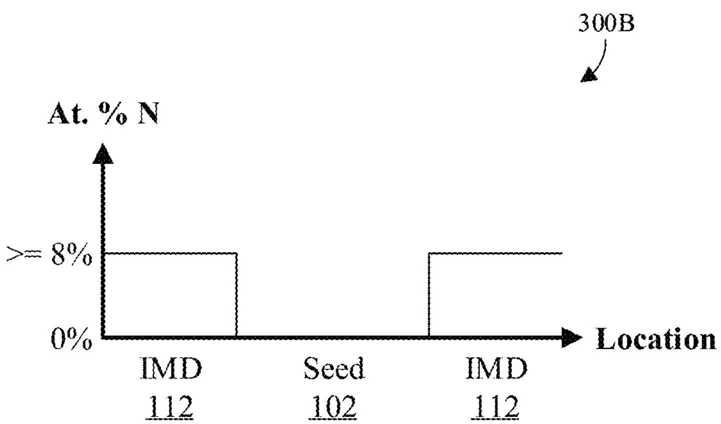

With reference to FIGS. 3A and 3B, nitrogen doping profiles 300A, 300B of some embodiments of the ferroelectric memory device of FIG. 1 are provided. The nitrogen doping profile 300A of FIG. 3A may, for example, be taken along line A in FIG. 1, whereas the nitrogen doping profile 300B of FIG. 3B may, for example, be taken along line B in FIG. 1.

Focusing on FIG. 3A, the ferroelectric layer 104 has a non-zero atomic percentage of nitrogen, and the bottom electrode layer 108 and the top electrode layer 110 have a higher atomic percentage of nitrogen than the ferroelectric layer 104. For example, the bottom electrode layer 108 and the top electrode layer 110 may have an atomic percentage of nitrogen greater than or equal to about 50%, whereas the ferroelectric layer 104 may have a non-zero atomic percentage of nitrogen less than or equal to about 5%. Other suitable percentages are, however, amenable.

The nitrogen doping of the ferroelectric layer 104 lowers the bandgap of the ferroelectric layer 104, thereby increasing read current through the memory cells 106. Increased read current leads to faster read times. The nitrogen doping of the bottom and top electrode layers 108, 110 reduces the oxygen scavenge effect, thereby reducing defects and improving electric field uniformity across the ferroelectric layer 104.

Focusing on FIG. 3B, the chimney seed structure 102 has an atomic percentage of nitrogen that is about zero, and the IMD layer 112 has a higher atomic percentage of nitrogen than the chimney seed structure 102. For example, the IMD layer 112 may have an atomic percentage of nitrogen greater than or equal to about 8%. Other suitable percentages are, however, amenable in alternative embodiments.

The nitrogen doping of the IMD layer 112 reduces surface energy of the chimney seed structure 102 at an interface at which the IMD layer 112 and the chimney seed structure 102 directly contact. The reduced surface energy, in turn, enhances growth of the ferroelectric crystalline phase at the chimney seed structure 102.

Figure 4A:
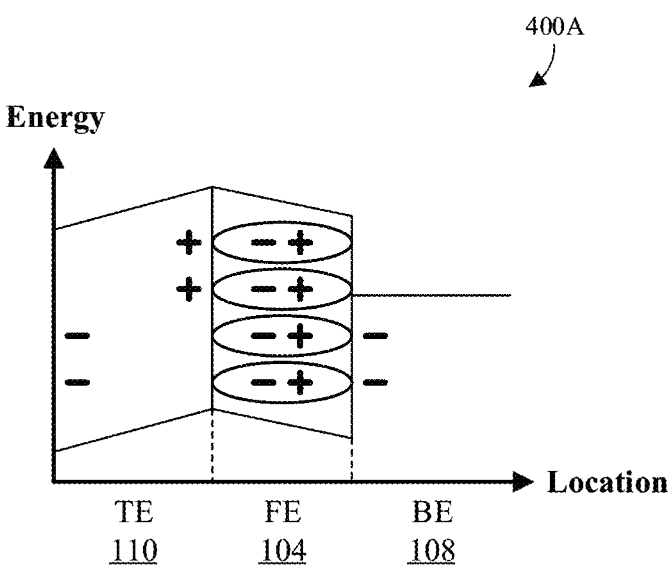
FIGS. 4A and 4B illustrate band diagrams of some first embodiments of the ferroelectric memory device of FIG. 1.
Figure 4B:
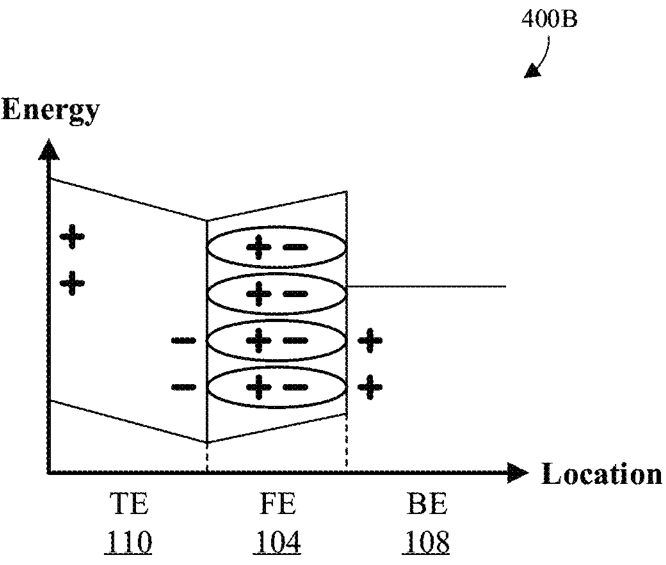

With reference to FIGS. 4A and 4B, band diagrams 400A, 400B of some first embodiments of the ferroelectric memory device of FIG. 1 are provided in which the top electrode layer 110 is semiconductive and the bottom electrode layer 108 is metal. Hence, the bottom electrode layer 108, the ferroelectric layer 104, and the top electrode layer 110 form an SFM structure. The band diagrams 400A, 400B may, for example, be taken along line A in FIG. 1. Further, the band diagrams 400A, 400B illustrate a fermi level of the bottom electrode layer 108 and individual bandgaps of the ferroelectric layer 104 and the top electrode layer 110.

In FIG. 400A, the remanent polarization of the ferroelectric layer 104 has a first state, resulting in a corresponding memory cell having a high resistive state (HRS). In FIG. 4B, the remanent polarization has a second state, resulting in the corresponding memory cell having a low resistance state (LRS). The HRS may represent a binary "1", whereas the LRS may represent a binary "0", or vice versa. Further, in both FIG. 4A and FIG. 4B, no electric field is applied across the ferroelectric layer 104 by the bottom and top electrode layers 108, 110.

Because the top electrode layer 108 is semiconductor, it is unable to provide sufficient charge to match the polarization of the ferroelectric layer 104. As a result, band bending occurs at the interface between the top electrode layer 110 and the ferroelectric layer 104. Further, an electric field across the interface is non-zero and a net charge between the ferroelectric layer 104 and the top electrode layer 110 is non-zero. In FIG. 4A, this effectively increases the barrier height and hence the resistance in the HRS. In FIG. 4B, this effectively decreases the barrier height and hence the resistance in the LRS. Hence, the read window is enlarged, and reliability of memory cells is enhanced. As noted above, the read window corresponds to a difference between read currents in the two remanent polarization states. The larger the read window, the easier it is to determine the remanent polarization state.

In contrast, if the top electrode layer 108 were metal, the top electrode layer 108 would be able to provide sufficient charge to match the polarization of the ferroelectric layer 104. As a result, band bending would not occur at the interface between the top electrode layer 110 and the ferroelectric layer 104. Further, an electric field across the interface would be zero and a net charge between the ferroelectric layer 104 and the top electrode layer 110 would be zero. Hence, the barrier height would be the same regardless of remanent polarization state and the read window would be small or non-existent.

Figure 5A:
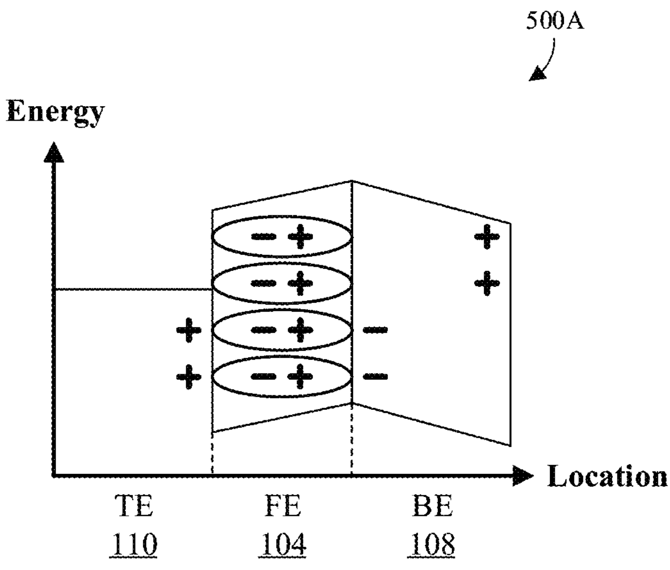
FIGS. 5A and 5B illustrate band diagrams of some second embodiments of the ferroelectric memory device of FIG. 1.
Figure 5B:
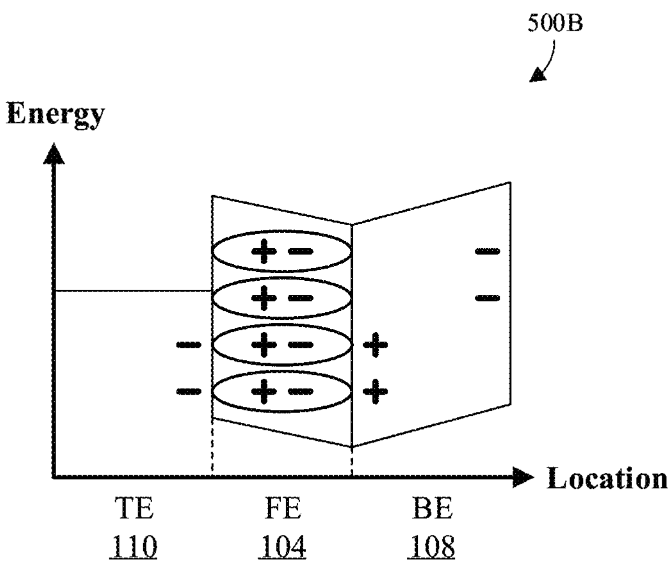

With reference to FIGS. 5A and 5B, band diagrams 500A, 500B of some second embodiments of the ferroelectric memory device of FIG. 1 are provided in which the top electrode layer 110 is metal and the bottom electrode layer 108 is semiconductive. Hence, the bottom and top electrode layers 108, 110 and the ferroelectric layer 104 form an MFS structure.

The band diagrams 500A, 500B may, for example, be taken along line A in FIG. 1. Further, the band diagrams 500A, 500B are respectively as the band diagrams 400A, 400B of FIGS. 4A and 4B are described, except that the description of the bottom electrode layer 108 and the top electrode layer 110 is reversed. Hence, the bottom electrode layer 108 promotes the increase in the read window, as described above for the top electrode layer 110.

Figure 6:
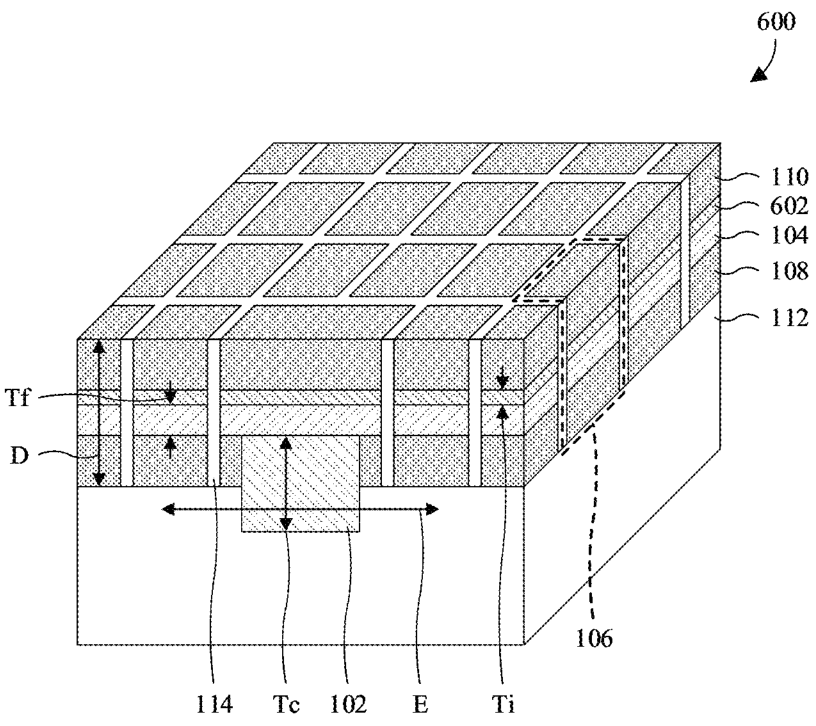
FIG. 6 illustrates a perspective view of some alternative embodiments of the ferroelectric memory device of FIG. 1 in which the ferroelectric memory device comprises an interfacial layer at a top electrode layer.

With reference to FIG. 6, a perspective view 600 of some alternative embodiments of the ferroelectric memory device of FIG. 1 is provided in which the ferroelectric memory device comprises an interfacial layer 602 between and directly contacting the top electrode layer 110 and the ferroelectric layer 104. As such, the top electrode layer 110, the interfacial layer 602, the ferroelectric layer 104, and the bottom electrode layer 108 may, for example, form a metal-ferroelectric-insulator-metal (MFIM) stack.

In some embodiments, the interfacial layer 602 is nitrogen doped. The nitrogen doping lowers surface energy of the ferroelectric layer 104 along an interface at which the interfacial layer 602 and the ferroelectric layer 104 directly contact. The lower surface energy enhances growth of the ferroelectric crystalline phase and stabilizes the ferroelectric crystalline phase to enhance remanent polarization. In some embodiments, an atomic percentage of nitrogen in the interfacial layer 602 is greater than or equal to about 10% or some other suitable percentage and/or is greater than an atomic percentage of nitrogen in the ferroelectric layer 104.

In some embodiments, the interfacial layer 602 has a dielectric constant greater than about 3 or some other suitable value and/or is or comprises an oxynitride, a nitride, or some other suitable dielectric material. For example, the interfacial layer 602 may be or comprise silicon oxynitride (e.g., SiON), aluminum oxynitride (e.g., AlON), titanium oxynitride (e.g., TiON), tantalum oxynitride (e.g., TaON), hafnium oxynitride (e.g., HfON), hafnium nitride (e.g., $Hf_3N_4$), some other suitable material(s), or any combination of the foregoing. In some embodiments, a thickness Ti of the interfacial layer 602 is less than about 2 nanometers, about 1 nanometer, or some other suitable value and/or is about 0.1-2 nanometers, about 0.1-1 nanometers, about 1-2 nanometers, or some other suitable value.

Figure 7:
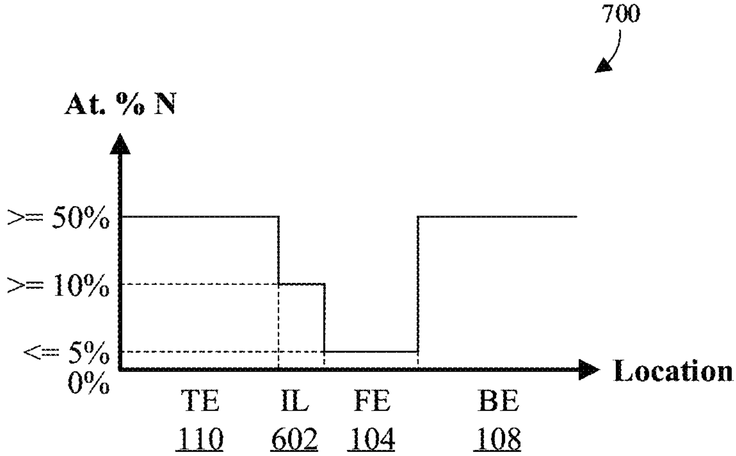
FIG. 7 illustrates a nitrogen doping profile of some embodiments of the ferroelectric memory device of FIG. 6.

With reference to FIG. 7, a nitrogen doping profile 700 of some embodiments of the ferroelectric memory device of FIG. 6 is provided. The nitrogen doping profile 700 may, for example, be taken along line D in FIG. 6. Further, even though described with regard to FIG. 1, the nitrogen doping profile 300A of FIG. 3A may, for example, be taken along line E in FIG. 6.

The ferroelectric layer 104 has a non-zero atomic percentage of nitrogen. Further, the interfacial layer 602 has a higher atomic percentage of nitrogen than the ferroelectric layer 104, and the bottom electrode layer 108 and the top electrode layer 110 have a higher atomic percentage of nitrogen than the interfacial layer 602. For example, the bottom electrode layer 108 and the top electrode layer 110 may have an atomic percentage of nitrogen greater than or equal to about 50%, the interfacial layer 602 may have an atomic percentage of nitrogen greater than or equal to about 10%, and the ferroelectric layer 104 may have a non-zero atomic percentage of nitrogen less than or equal to about 5%. Other suitable percentages are, however, amenable in alternative embodiments.

The nitrogen doping of the ferroelectric layer 104 lowers the bandgap of the ferroelectric layer 104, thereby increasing read current for faster read times. The nitrogen doping of the bottom and top electrode layers 108, 110 reduces the oxygen scavenge effect, thereby reducing defects and improving electric field uniformity. The nitrogen doping of the interfacial layer 602 reduces surface energy at the ferroelectric layer 104 to stabilize the ferroelectric crystalline phase and enhance growth thereof.

Figure 8A:
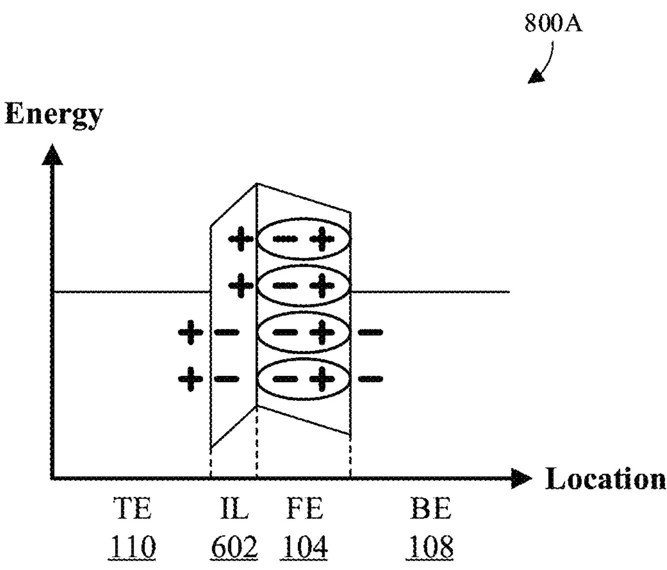
FIGS. 8A and 8B illustrate band diagrams of some embodiments of the ferroelectric memory device of FIG. 6.
Figure 8B:
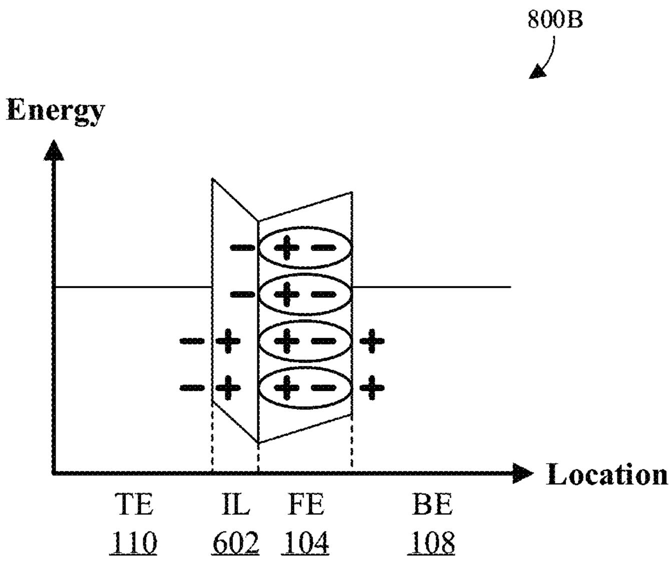

With reference to FIGS. 8A and 8B, band diagrams 800A, 800B of some embodiments of the ferroelectric memory device of FIG. 6 are provided. The band diagrams 800A, 800B may, for example, be taken along line D in FIG. 6.

The bottom and top electrode layers 108, 110 are or comprise metal, whereby the band diagrams 800A, 800B illustrate fermi levels of the bottom and top electrode layers 108, 110. Further, the band diagrams 800A, 800B illustrate a bandgap of the ferroelectric layer 104 and a bandgap of the interfacial layer 602 for different states of a remanent polarization of the ferroelectric layer 104. In FIG. 8A, the remanent polarization has a first state, resulting in a corresponding memory cell having a HRS. In FIG. 8B, the remanent polarization has a second state, resulting in the corresponding memory cell having a LRS. Further, in both FIG. 8A and FIG. 8B, no electric field is applied across the ferroelectric layer 104 and the interfacial layer 602 by the bottom and top electrode layers 108, 110.

The interfacial layer 602 lacks sufficient charge to match the polarization of the ferroelectric layer 104. As a result, band bending occurs at the interface between the interfacial layer 602 and the ferroelectric layer 104. Further, an electric field across the interface is non-zero and a net charge between the ferroelectric layer 104 and the interfacial layer 602 is non-zero. In FIG. 8A, this effectively increases the barrier height and hence the resistance in the HRS. In FIG. 8B, this effectively decreases the barrier height and hence the resistance in the LRS. Hence, the read window is enlarged, and reliability of memory cells is enhanced.

In contrast, if the interfacial layer 602 were omitted, the top electrode layer 108 would provide sufficient charge to match the polarization of the ferroelectric layer 104. As a result, band bending would not occur at the interface between the top electrode layer 110 and the ferroelectric layer 104. Further, an electric field across the interface would be zero and a net charge between the ferroelectric layer 104 and the top electrode layer 110 would be zero. Hence, the barrier height would be the same regardless of remanent polarization state and the read window would be small or non-existent.

Figure 9:
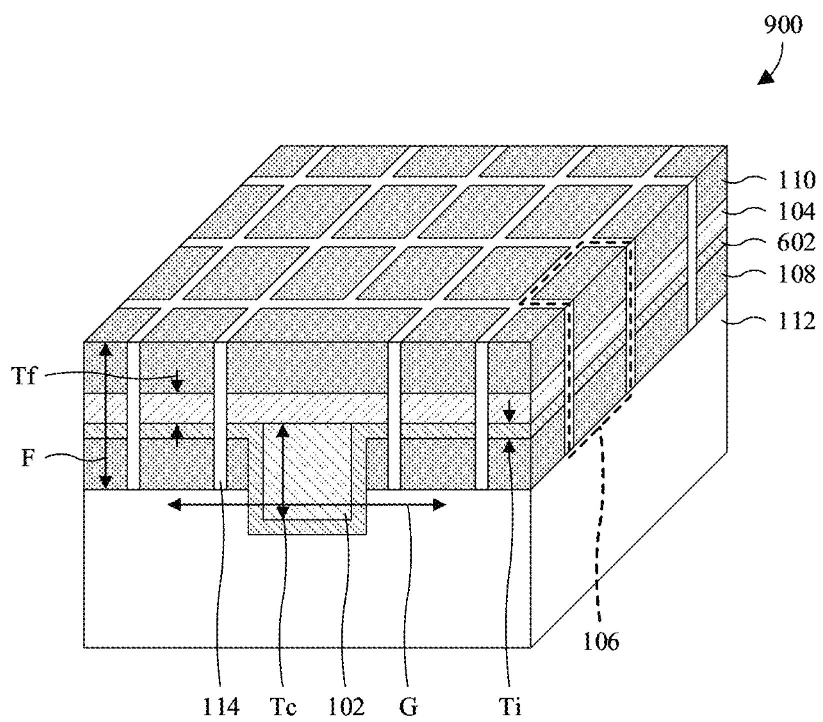
FIG. 9 illustrates a perspective view of some alternative embodiments of the ferroelectric memory device of FIG. 6 in which the interfacial layer is at a bottom electrode layer.

With reference to FIG. 9, a perspective view 900 of some alternative embodiments of the ferroelectric memory device of FIG. 6 is provided in which the interfacial layer 602 is between and directly contacts the bottom electrode layer 108 and the ferroelectric layer 104. As such, the top electrode layer 110, the ferroelectric layer 104, the interfacial layer 602, and the bottom electrode layer 108 may, for example, form a metal-insulator-ferroelectric-metal (MIFM) stack. Further, the interfacial layer 602 extends through the bottom electrode layer 108 and wraps around the chimney seed structure 102 to separate the chimney seed structure 102 from the IMD layer 112 and the bottom electrode layer 108.

Figure 10A:
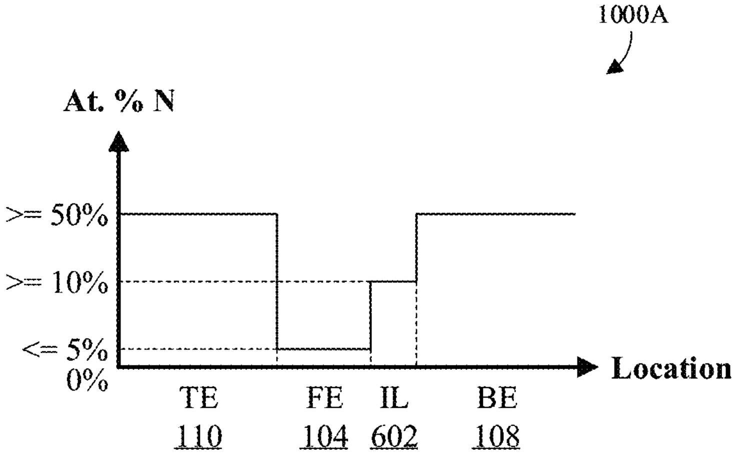
FIGS. 10A and 10B illustrate nitrogen doping profiles of some embodiments of the ferroelectric memory device of FIG. 9.
Figure 10B:
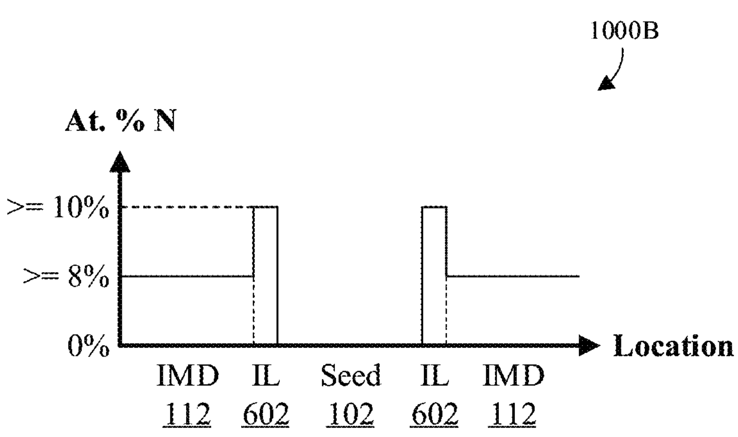

With reference to FIGS. 10A and 10B, nitrogen doping profiles 1000A, 1000B of some embodiments of the ferroelectric memory device of FIG. 9 are provided. The nitrogen doping profile 1000A of FIG. 10A may, for example, be taken along line F in FIG. 9, whereas the nitrogen doping profile 1000B of FIG. 10B may, for example, be taken along line G in FIG. 9.

Focusing on FIG. 10A, the ferroelectric layer 104 has a non-zero atomic percentage of nitrogen, the interfacial layer 602 has a greater atomic percentage of nitrogen than the ferroelectric layer 104, and the bottom electrode layer 108 and the top electrode layer 110 have a greater atomic percentage of nitrogen than the interfacial layer 602. For example, the bottom electrode layer 108 and the top electrode layer 110 may have an atomic percentage of nitrogen greater than or equal to about 50%, the interfacial layer 602 may have an atomic percentage of nitrogen greater than or equal to about 10%, and the ferroelectric layer 104 may have a non-zero atomic percentage of nitrogen less than or equal to about 5%. Other suitable atomic percentages are, however, amenable in alternative embodiments.

Focusing on FIG. 10B, the chimney seed structure 102 has an atomic percentage of nitrogen that is about zero, the IMD layer 112 has a non-zero atomic percentage of nitrogen, and the interfacial layer 602 has a higher atomic percentage of nitrogen than the IMD layer 112. For example, the IMD layer 112 may have an atomic percentage of nitrogen greater than or equal to about 8% and the interfacial layer 602 may have an atomic percentage of nitrogen greater than or equal to about 10%. Other suitable atomic percentages are, however, amenable in alternative embodiments.

Figure 11A:
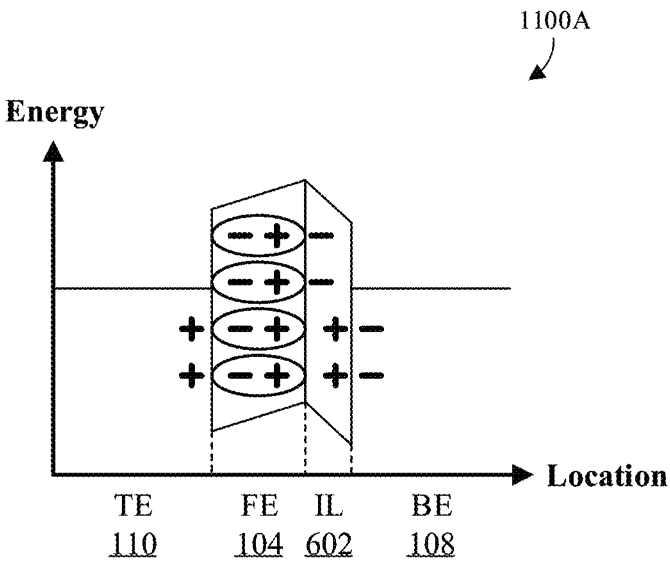
FIGS. 11A and 11B illustrate band diagrams of some embodiments of the ferroelectric memory device of FIG. 9.
Figure 11B:
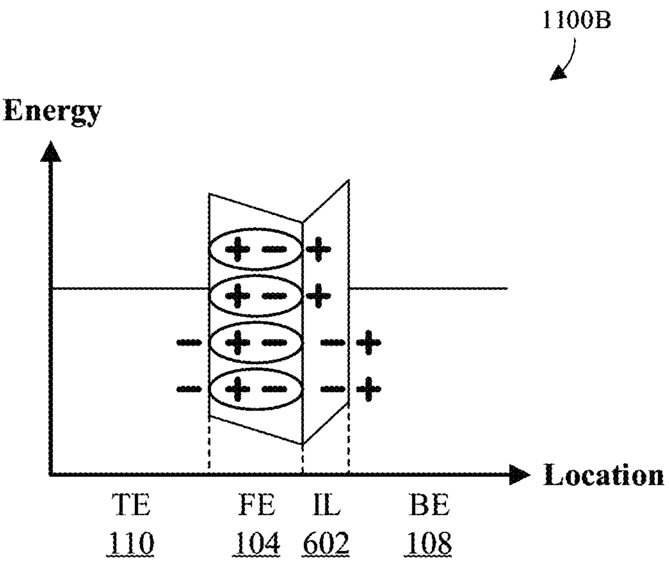

With reference to FIGS. 11A and 11B, band diagrams 1100A, 1100B of some embodiments of the ferroelectric memory device of FIG. 9 are provided. The band diagrams 1100A, 1100B may, for example, be taken along line F in FIG. 9. Further, the band diagrams 1100A, 1100B are respectively as the band diagrams 800A, 800B of FIGS. 8A and 8B are described, except that that the interfacial layer 602 is at the bottom electrode layer 108.

Figure 12:
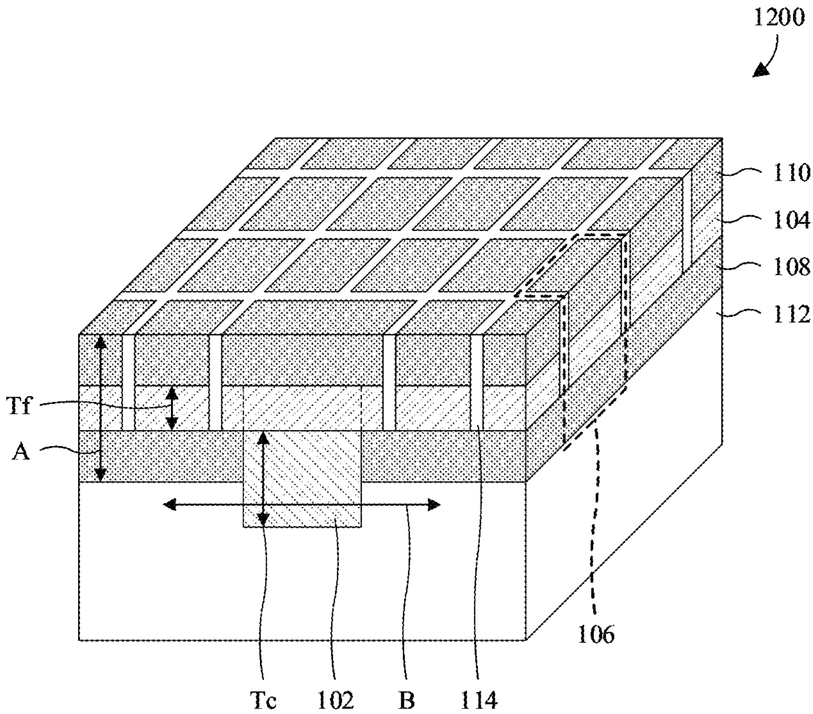
FIG. 12 illustrates a perspective view of some alternative embodiments of the ferroelectric memory device of FIG. 1 in which a bottom electrode layer is continuous.

With reference to FIG. 12, a perspective view 1200 of some alternative embodiments of the ferroelectric memory device of FIG. 1 is provided in which a bottom electrode layer 108 is continuous. The dielectric wall 114 extends through the top electrode layer 110 and the ferroelectric layer 104 and stops at a top of the bottom electrode layer 108. As such, the memory cells 106 share the same continuous portion of the bottom electrode layer 108. In other words, the bottom electrode layer 108 is continuous from memory cell to memory cell.

Figure 13A:
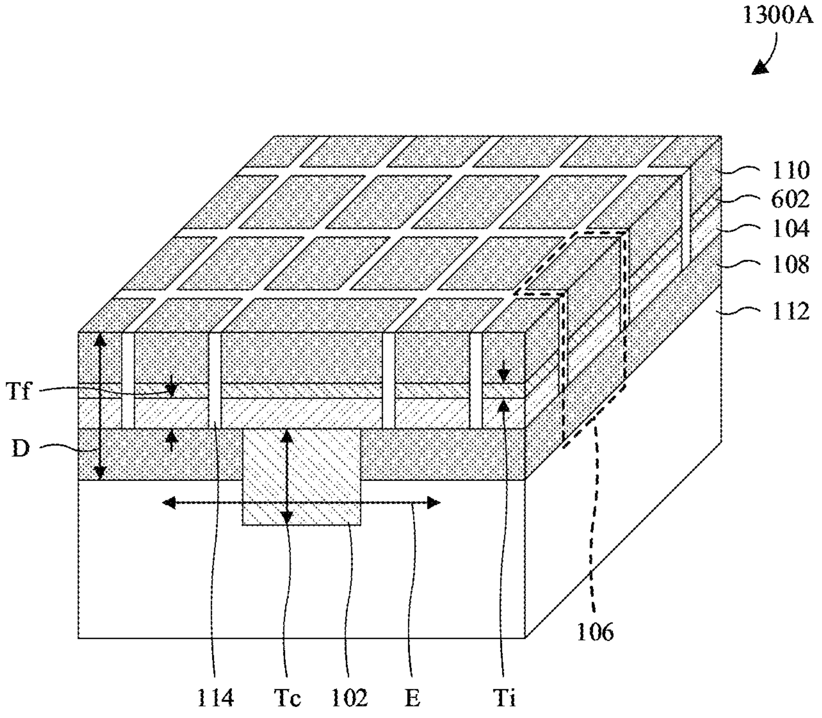
FIGS. 13A and 13B illustrate perspective views of some alternative embodiments of the ferroelectric memory device of FIG. 12.
Figure 13B:
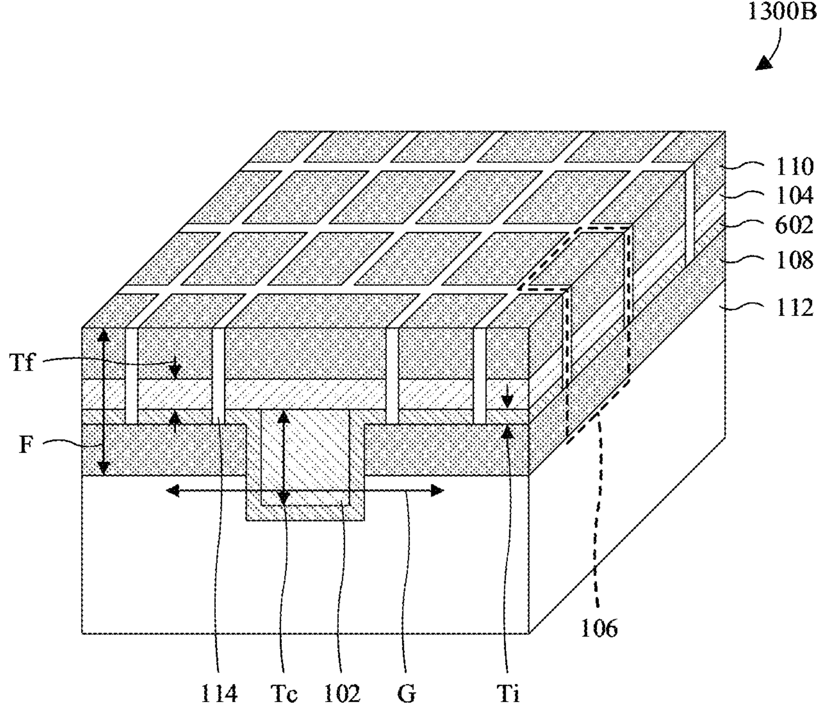

With reference to FIGS. 13A and 13B, perspective views 1300A, 1300B of some alternative embodiments of the ferroelectric memory device of FIG. 12 are provided in which the ferroelectric memory device has the interfacial layer 602. In FIG. 13A, the interfacial layer 602 is at the top electrode layer 110 as in FIG. 6. In FIG. 13B, the interfacial layer 602 is at the bottom electrode layer 108 as in FIG. 9. Further, the interfacial layer 602 is discontinuous. The dielectric wall 114 extends through the interfacial layer 602 and stops at a top of the bottom electrode layer 108. In alternative embodiments, the interfacial layer 602 is continuous and the dielectric wall 114 stops at a top of the interfacial layer 602.

Figure 14:
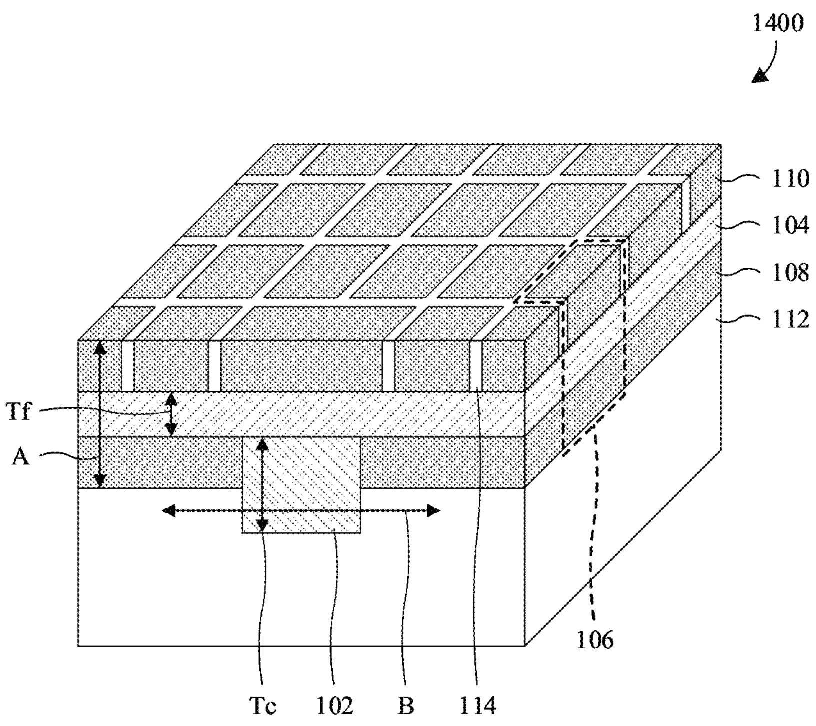
FIG. 14 illustrates a perspective view of some alternative embodiments of the ferroelectric memory device of FIG. 1 in which a bottom electrode layer and a ferroelectric layer are continuous.

With reference to FIG. 14, a perspective view 1400 of some alternative embodiments of the ferroelectric memory device of FIG. 1 is provided in which the bottom electrode layer 108 and the ferroelectric layer 104 are continuous. The dielectric wall 114 extends through the top electrode layer 110 and stops at a top of the ferroelectric layer 104. As such, the memory cells 106 share the same continuous portion of the bottom electrode layer 108 and the same contiguous portion of the ferroelectric layer 104. In other words, the bottom electrode layer 108 and the ferroelectric layer 104 are continuous from memory cell to memory cell. Note that even though the memory cells 106 are not physically separated from each other at the ferroelectric layer 104, remanent polarizations of the memory cells 106 remain localized to the individual memory cells 106 and hence remain separated from each other.

Figure 15A:
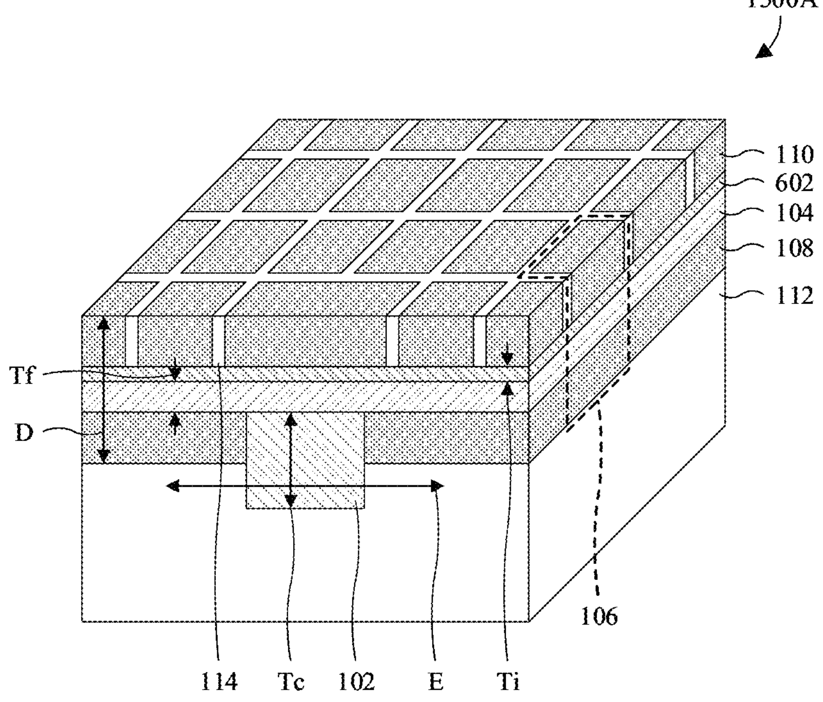
FIGS. 15A and 15B illustrate perspective views of some alternative embodiments of the ferroelectric memory device of FIG. 14.
Figure 15B:
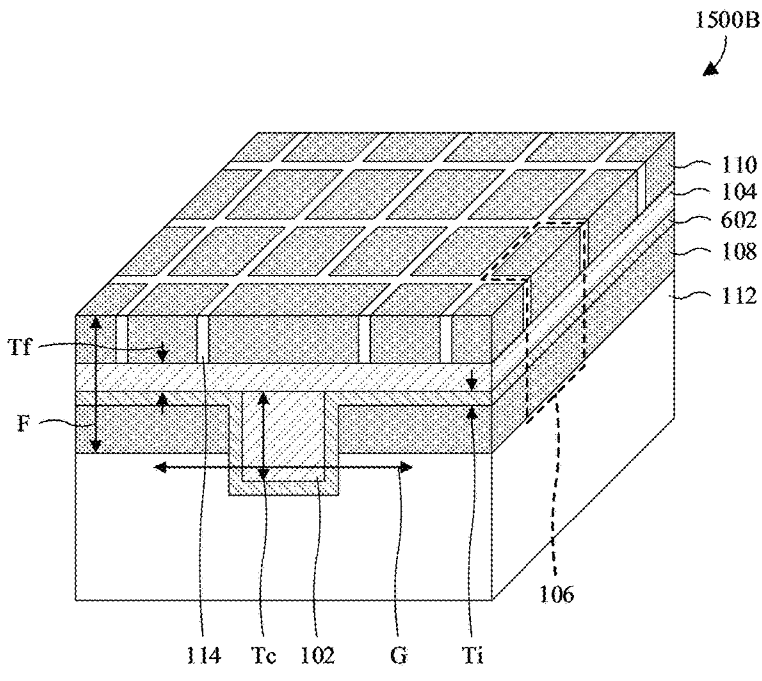

With reference to FIGS. 15A and 15B, perspective views 1500A, 1500B of some alternative embodiments of the ferroelectric memory device of FIG. 14 are provided in which the ferroelectric memory device has the interfacial layer 602. In FIG. 15A, the interfacial layer 602 is at the top electrode layer 110 as in FIG. 6. Further, the interfacial layer 602 is continuous and the dielectric wall 114 stops at a top of the interfacial layer 602. In alternative embodiments, the interfacial layer 602 is discontinuous. Further, the dielectric wall 114 extends through the interfacial layer 602 and stops at a top of the ferroelectric layer 104. In FIG. 15B, the interfacial layer 602 is at the bottom electrode layer 108 as in FIG. 9.

Figure 16:
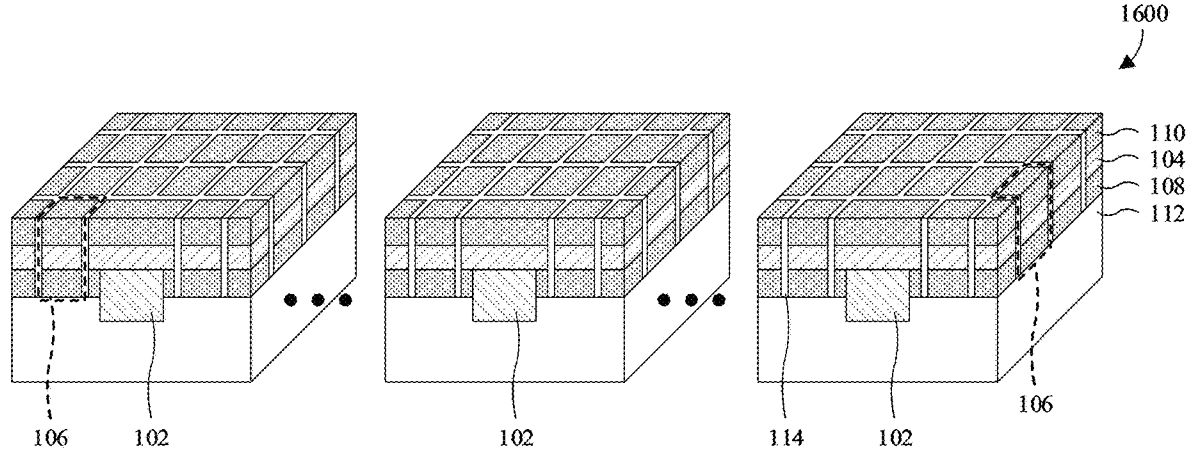
FIG. 16 illustrates a perspective view of some embodiments of the ferroelectric memory device of FIG. 1 in which the ferroelectric memory device comprises a plurality of chimney seed structures.

With reference to FIG. 16, a perspective view 1600 of some embodiments of the ferroelectric memory device of FIG. 1 is provided in which the ferroelectric memory device comprises a plurality of chimney seed structures 102. The chimney seed structures 102 are each as their counterpart is described with regard to FIG. 1. Further, the chimney seed structures 102 are evenly spaced across a bottom of the ferroelectric layer 104. During manufacture, the ferroelectric crystalline phase grows laterally outwards from each other the chimney seed structures 102. The growth meets midway between each neighboring pair of chimney seed structures 102 and, because of the even spacing of the chimney seed structures 102, results in high ferroelectric-crystalline-phase uniformity across the ferroelectric layer 104.

While FIG. 16 is illustrated using embodiments of the ferroelectric memory device in FIG. 1, embodiments of the ferroelectric memory device in any one or combination of the preceding figures are amenable. For example, the ferroelectric memory device of FIG. 16 may alternatively have the interfacial layer 602 as in FIG. 6 or 9.

Figure 17:
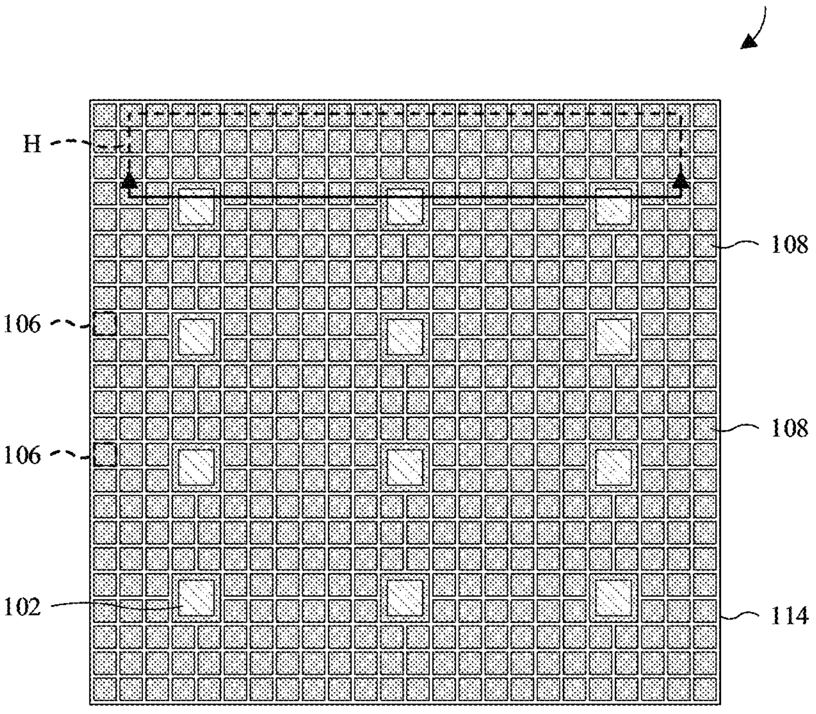
FIG. 17 illustrates a top layout view of some embodiments of the ferroelectric memory device of FIG. 16.

With reference to FIG. 17, a top layout view 1700 of some embodiments of the ferroelectric memory device of FIG. 16 is provided. The perspective view 1600 of FIG. 16 may, for example, be taken within box H.

The chimney seed structures 102 are in a plurality of rows (e.g., 4 rows) and a plurality of columns (e.g., 3 columns). Further, the chimney seed structures 102 are evenly spaced along the rows and are evenly spaced along the columns to promote uniform ferroelectric-crystalline-phase growth. The memory cells 106 are in a plurality of rows (e.g., 23 rows) and a plurality of columns (e.g., 24 columns). Further, the memory cells 106 are arranged around the chimney seed structures 102 so ferroelectric-crystalline-phase growth from the chimney seed structures 102 grows to a portion of the ferroelectric layer 104 at which the memory cells 106 are.

Figure 18:
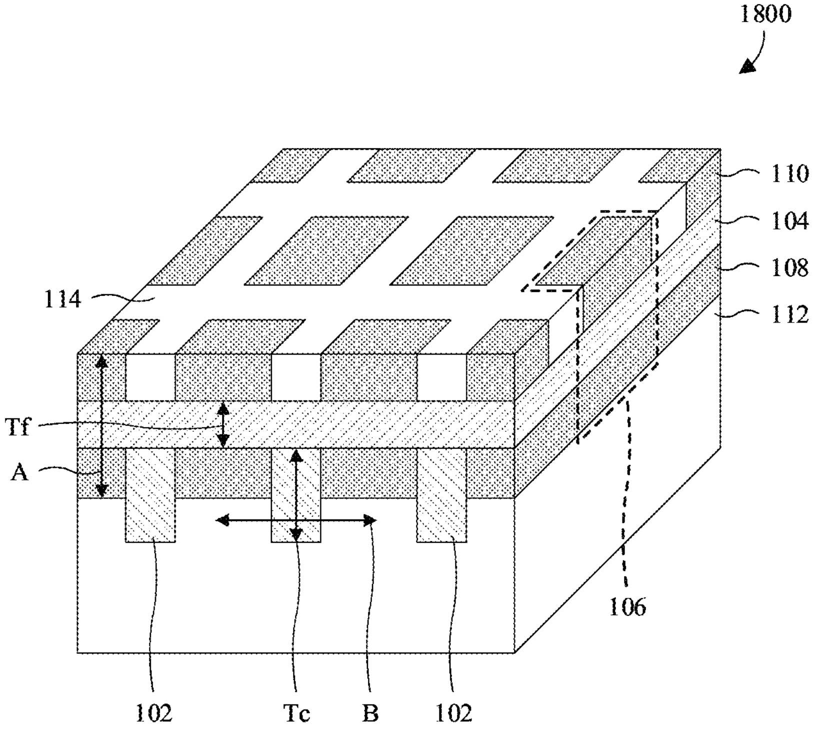
FIG. 18 illustrates a perspective view of some alternative embodiments of the ferroelectric memory device of FIG. 1 in which the ferroelectric memory device comprises a plurality of chimney seed structure underlying a dielectric wall segmenting a top electrode layer.

With reference to FIG. 18, a perspective view 1800 of some alternative embodiments of the ferroelectric memory device of FIG. 1 is provided in which the ferroelectric memory device comprises a plurality of chimney seed structures 102 underlying the dielectric wall 114. In some embodiments, the dielectric wall 114 completely covers the chimney seed structures 102. The chimney seed structures 102 are each as their counterpart is described with regard to FIG. 1. Further, in some embodiments, the ferroelectric memory device has nitrogen doping profiles respectively along lines A and B, which are respectively as illustrated at FIGS. 3A and 3B. Other suitable nitrogen doping profiles are, however, amenable.

Figure 19A:
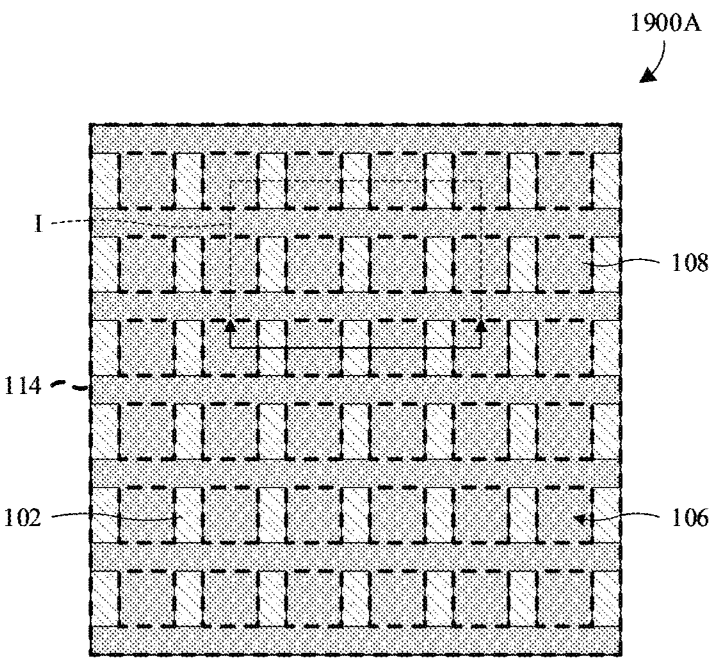
FIGS. 19A and 19B illustrate top layout views of some embodiments of the ferroelectric memory device of FIG. 18.
Figure 19B:
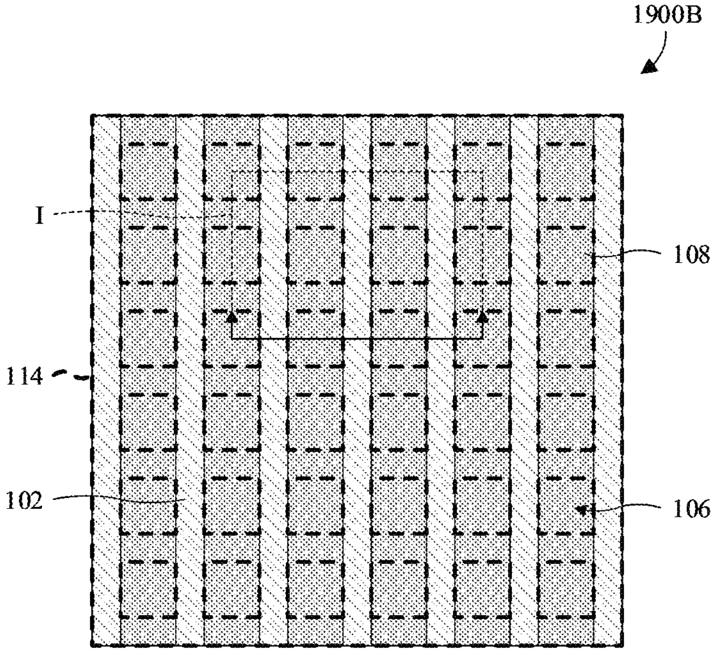

With reference to FIGS. 19A and 19B, top layout views 1900A, 1900B of some embodiments of the ferroelectric memory device of FIG. 18 are provided. The perspective view 1800 of FIG. 18 may, for example, be taken within box I. In FIG. 19A, the chimney seed structures 102 are in a plurality of rows and a plurality of columns that overlap with the dielectric wall 114 (shown in phantom). In FIG. 19B, the chimney seed structures 102 are line shaped and extend in parallel between neighboring columns of memory cells 106.

Figure 20A:
FIGS. 20A and 20B illustrate perspective views of some alternative embodiments of the ferroelectric memory device of FIG. 18 in which the ferroelectric memory device comprises an interfacial layer.
Figure 20A:
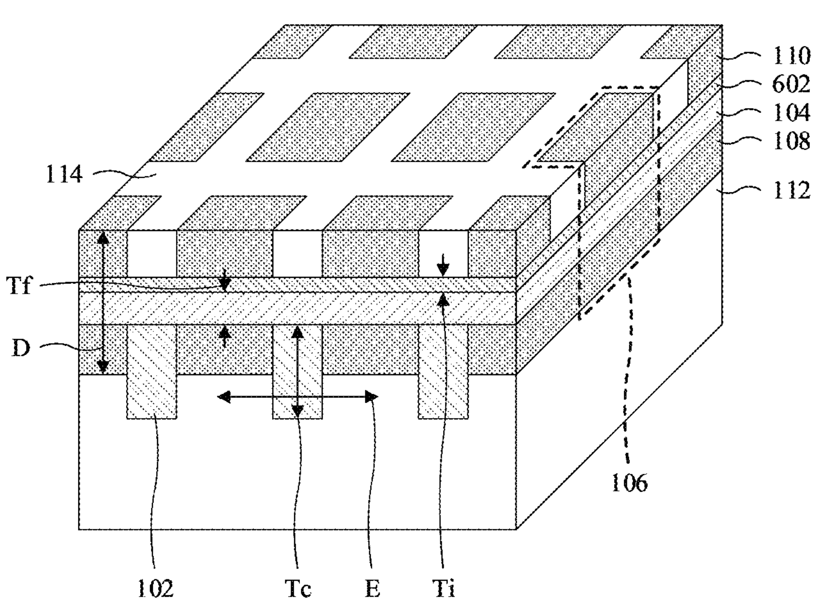
Figure 20B:
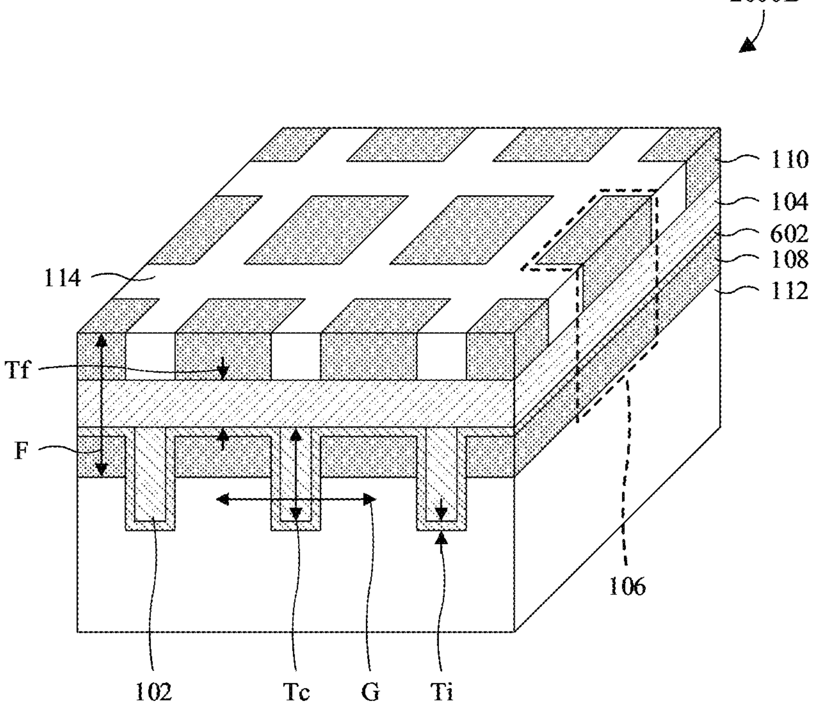

With reference to FIGS. 20A and 20B, perspective views 2000A, 2000B of some alternative embodiments of the ferroelectric memory device of FIG. 18 are provided in which the ferroelectric memory device comprises the interfacial layer 602. In FIG. 20A, the interfacial layer 602 is at the top electrode layer 110 as in FIG. 6. In FIG. 20B, the interfacial layer 602 is at the bottom electrode layer 108 as in FIG. 9.

Figure 21:
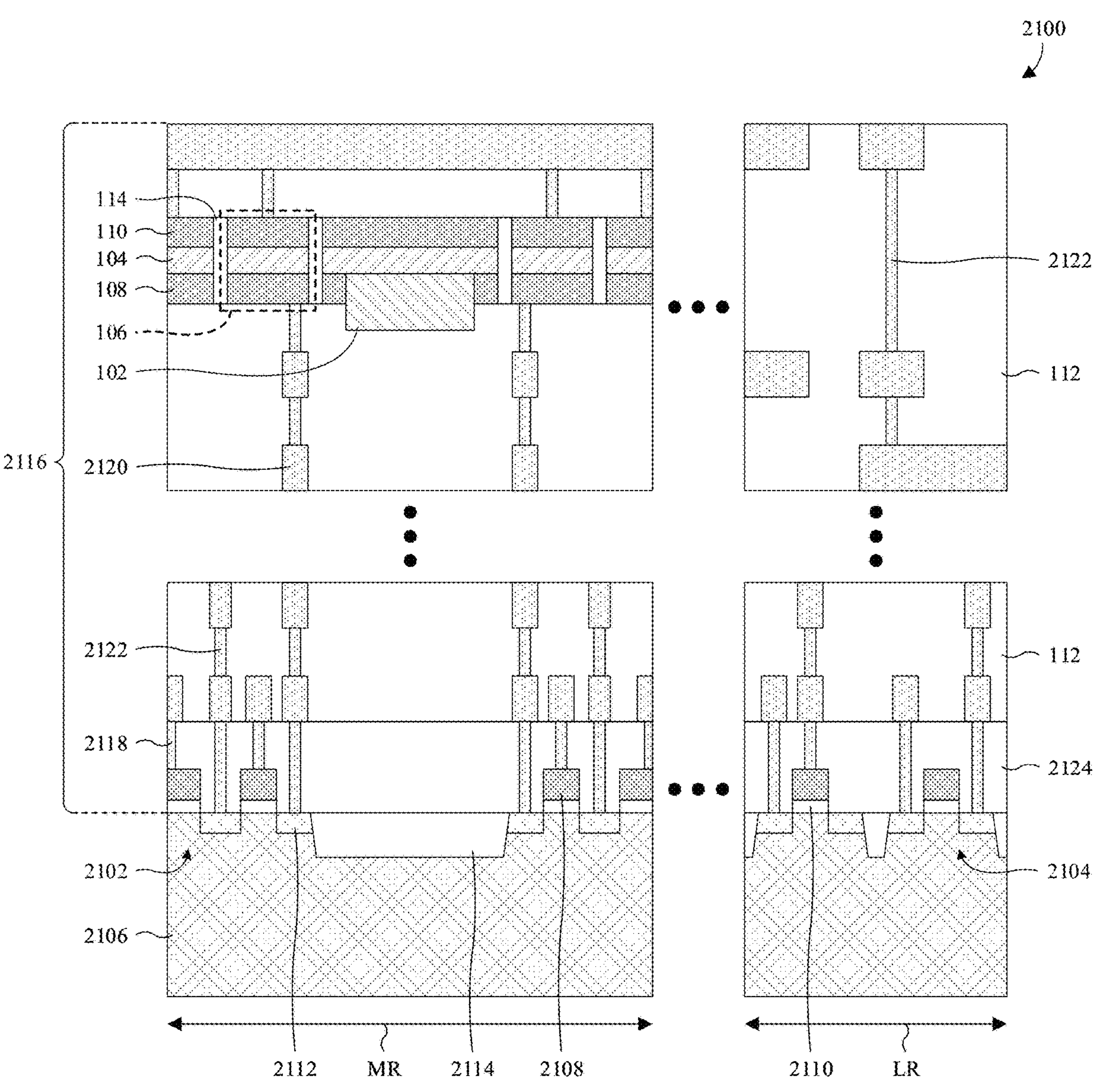
FIG. 21 illustrates a cross-sectional view of some embodiments of the ferroelectric memory device of FIG. 1 in which memory cells of the ferroelectric memory device are paired with individual access transistors.

With reference to FIG. 21, a cross-sectional view 2100 of some embodiments of the ferroelectric memory device of FIG. 1 is provided in which the memory cells 106 are paired with individual access transistors 2102. In some embodiments, each memory-cell-access-transistor pair may be regarded as a one-transistor-one-resistor (1T1R) cell or a one-transistor-one-capacitor (1T1C) cell depending on a mode of operation.

The access transistors 2102 and the memory cells 106 are at a memory region MR of the ferroelectric memory device. The memory region MR neighbors a logic region LR of the ferroelectric memory device, which accommodates logic transistors 2104. The logic transistors 2104 may, for example, support operation of a memory array formed by the access transistors 2102 and the memory cells 106, whereby the ferroelectric memory device may, for example, be regarded as an embedded ferroelectric memory device.

The access transistors 2102 and the logic transistors 2104 are on a substrate 2106. In some embodiments, the access transistors 2102 and/or the logic transistors 2104 are metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing. The access transistors 2102 and the logic transistors 2104 comprise corresponding gate electrodes 2108, corresponding gate dielectric layers 2110, and corresponding pairs of source/drain regions 2112.

The gate electrodes 2108 respectively overlie the gate dielectric layers 2110 to form gate stacks, and each gate stack is sandwiched between corresponding source/drain regions 2112. The source/drain regions 2112 are in the substrate 2106. As used herein, source/drain region(s) may refer to a source or a drain, individually or collectively dependent upon the context. The substrate 2106 may, for example, be a bulk silicon substrate, a silicon-on-insulator (SOI) substrate, or some other suitable type of semiconductor substrate.

A trench isolation structure 2114 separates individual transistors and/or individual groups (e.g., pairs) of neighboring transistors from each other. The trench isolation structure 2114 is or comprises dielectric material and may, for example, be a shallow trench isolation (STI) structure or some other suitable type of trench isolation structure.

An interconnect structure 2116 overlies and electrically couples to the access transistors 2102 and the logic transistors 2104. The interconnect structure 2116 comprises a plurality of contacts 2118, a plurality of wires 2120, and a plurality of vias 2122. The contacts 2118 are in an interlayer dielectric (ILD) layer 2124 and extend from the access transistors 2102 and the logic transistors 2104. The wires 2120 and the vias 2122 overlie the contacts 2118 in an IMD layer 112 and are alternatingly stacked from the contacts 2118.

The memory cells 106 are in the IMD layer 112 and are electrically coupled respectively to the access transistors 2102 by the interconnect structure 2116. The memory cells 106 are as illustrated and described with regard to FIG. 1 but may additionally or alternatively be as illustrated and described with regard to any one or combination of FIGS. 1 to 20B.

With reference FIGS. 22-24, 25A and 25B, 26-29, 30A and 30B to 33A and 33B, 34, and 35, a series of views of some embodiments of a method for forming a ferroelectric memory device comprising a chimney seed structure is provided. Figure numbers suffixed with "A" or no letter correspond to cross-sectional views, whereas figure numbers suffixed with "B" correspond to top layout views of memory regions MR in like numbered figures suffixed with "A". Further, cross-sectional portions of the memory regions MR illustrated in figures suffixed with "A" may be taken along line J in like numbered figures suffixed with "B". The ferroelectric memory device may, for example, be as illustrated at FIG. 1 and/or FIG. 21.

Figure 22:
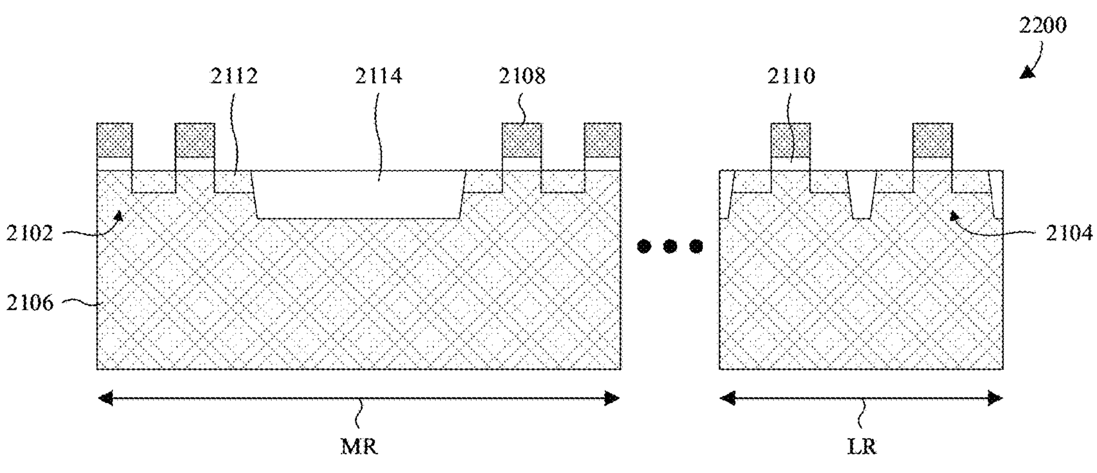

As illustrated by a cross-sectional view 2200 of FIG. 22, a plurality of access transistors 2102 and a plurality of logic transistors 2104 are formed on a substrate 2106. The access transistors 2102 are formed at a memory region MR, and the logic transistors 2104 are formed at a logic region LR. The access transistors 2102 and the logic transistors 2104 comprise corresponding gate electrodes 2108, corresponding gate dielectric layers 2110, and corresponding pairs of source/drain regions 2112. The gate electrodes 2108 respectively overlie the gate dielectric layers 2110 to form gate stacks, and each gate stack is sandwiched between corresponding source/drain regions 2112 in the substrate 2106.

Also illustrated by the cross-sectional view 2200 of FIG. 22, a trench isolation structure 2114 is formed separating individual transistors and/or individual groups (e.g., pairs) of neighboring transistors from each other.

Figure 23:
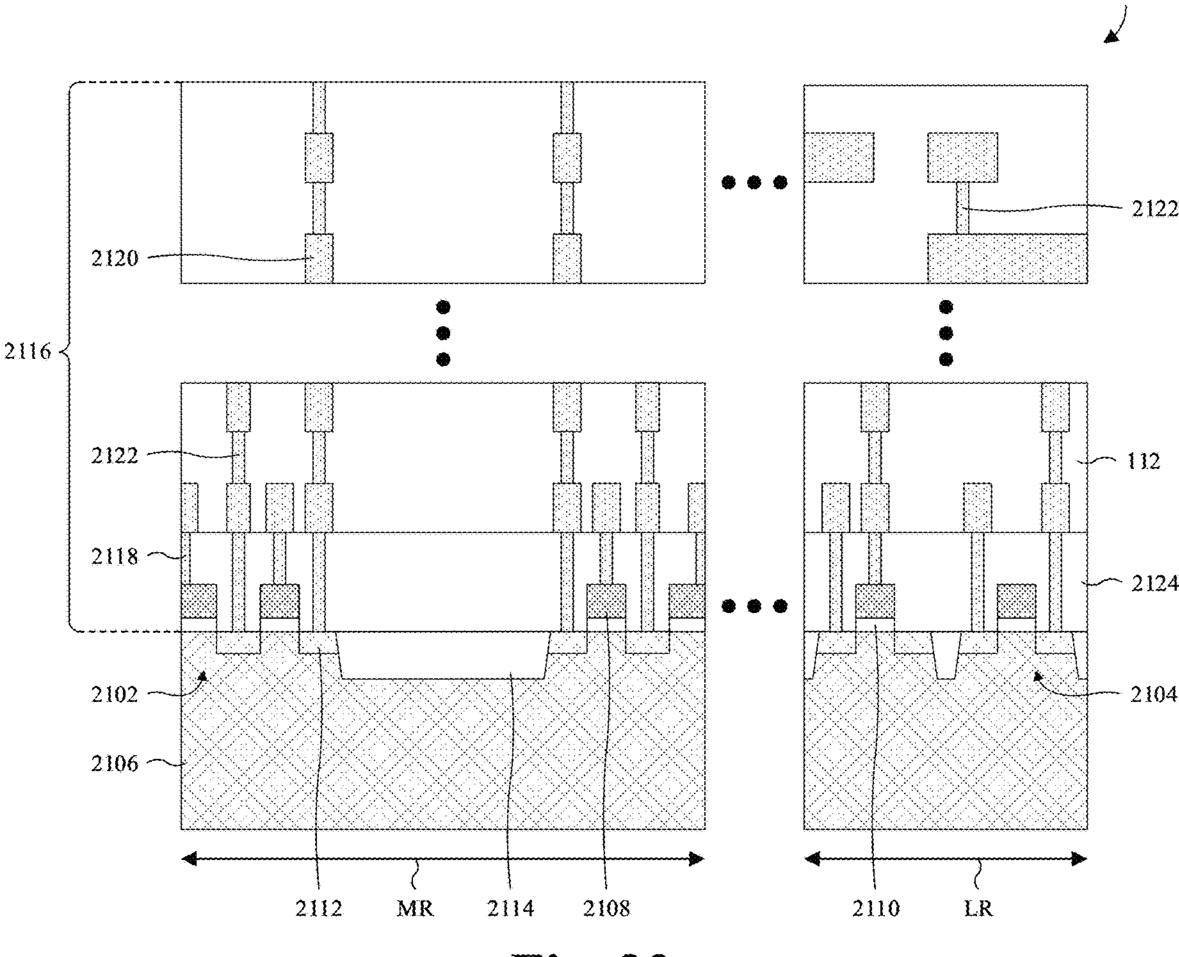

As illustrated by a cross-sectional view 2300 of FIG. 23, an interconnect structure 2116 is partially formed overlying and electrically coupled to the access transistors 2102 and the logic transistors 2104. The interconnect structure 2116 comprises a plurality of contacts 2118, a plurality of wires 2120, and a plurality of vias 2122. The contacts 2118 are in an ILD layer 2124 and extend from the access transistors 2102 and the logic transistors 2104. The wires 2120 and the vias 2122 overlie the contacts 2118 in an IMD layer 112 and are alternatingly stacked from the contacts 2118 to a top of the interconnect structure 2116.

In some embodiments, the IMD layer 112 is a low k dielectric material with a dielectric constant less about 9, about 3.9, or some other suitable value. In some embodiments, the IMD layer 112 is or comprises silicon nitride (e.g., $Si_3N_4$), silicon carbon nitride (SiCN), silicon oxynitride (SiON), some other suitable material(s), or any combination of the foregoing. In some embodiments, the IMD layer 112 is nitrogen doped. The nitrogen doping may, for example, be across an entirety of the IMD layer 112 or may, for example, be localized to a top of the IMD layer 112. The nitrogen doping may, for example, have an atomic percentage greater than or equal to about 8%, about 10%, about 15%, or some other suitable percentage.

Figure 24:
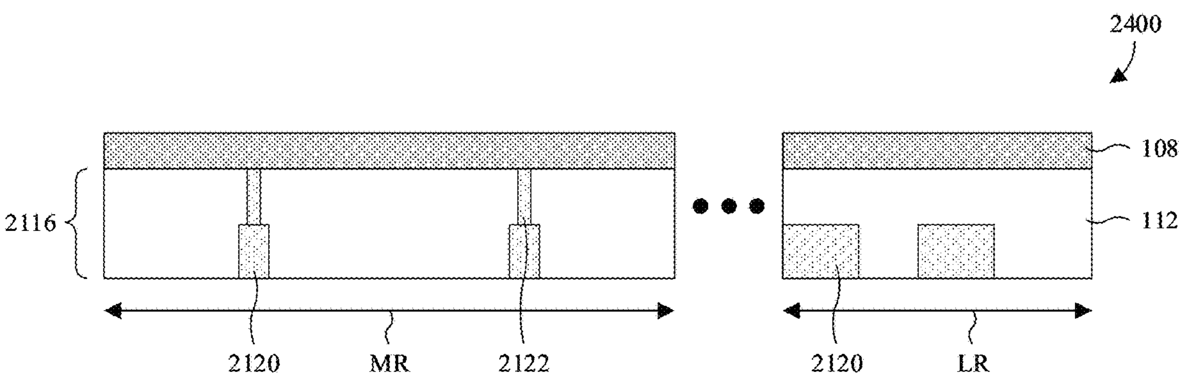

As illustrated by a cross-sectional view 2400 of FIG. 24, a bottom electrode layer 108 is deposited atop a layer of vias 2122 at the top of the interconnect structure 2116. For clarity, a lower portion of the structure formed up to FIG. 23 is hereafter omitted. However, it is to be appreciated that the lower portion persists hereafter even though not shown.

In some embodiments, the bottom electrode layer 108 is conductive. For example, the bottom electrode layer 108 may, for example, be or comprise a pure metal, a refractory metal nitride, a conductive oxide, or some other suitable material. In some embodiments, the bottom electrode layer 108 is semiconductive. For example, the bottom electrode layer 108 may be or comprise a single crystalline or polycrystalline semiconductor material that is doped. In some embodiments, the semiconductor material has a bandgap less than about 2 or some other suitable value. Further, in some embodiments, the semiconductor material is or comprises silicon, germanium, ITO, or some other suitable material. In some embodiments, the bottom electrode layer 108 is nitrogen doped. The nitrogen doping may, for example, have an atomic percentage greater than or equal to about 50%, about 60%, or some other suitable percentage.

Figure 25A:
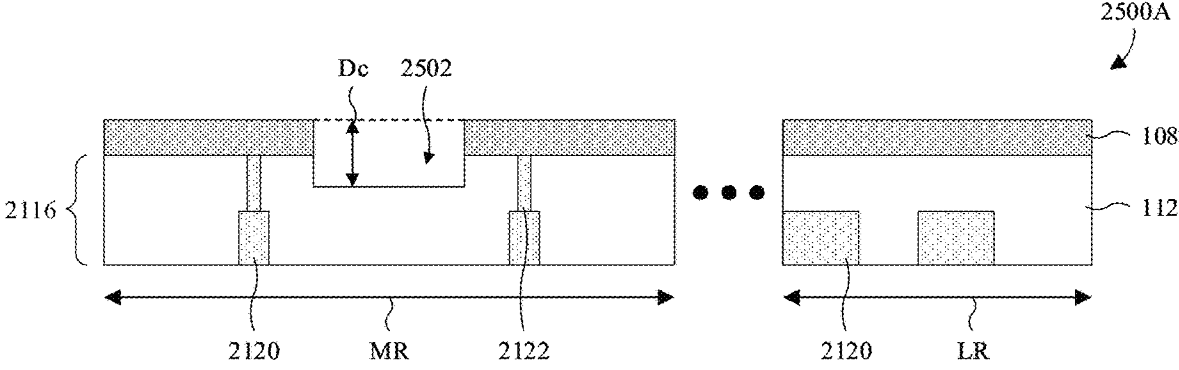
Figure 25B:
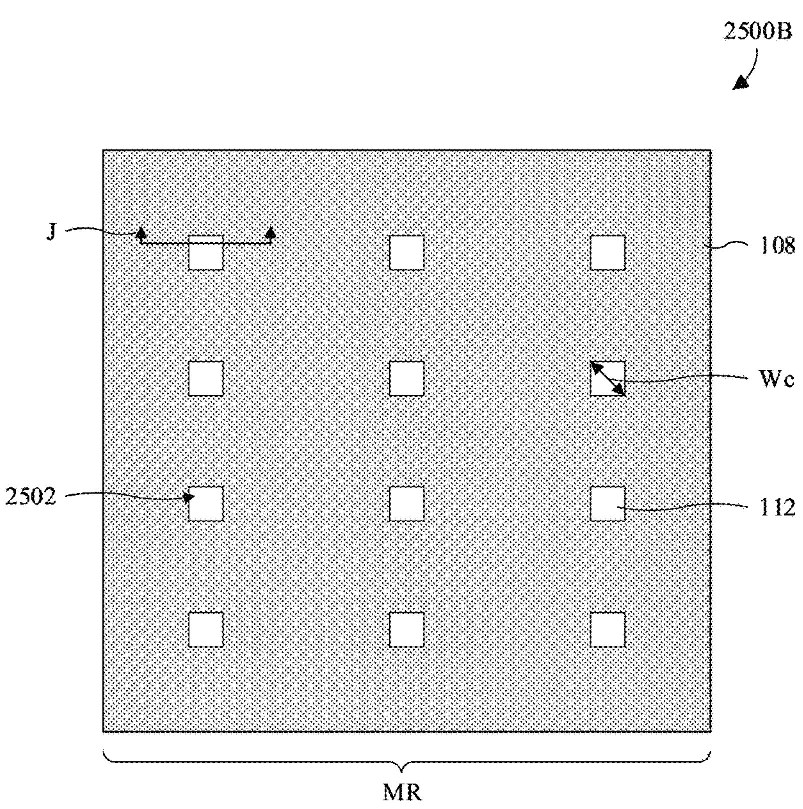

As illustrated by a cross-sectional view 2500A of FIG. 25A, and a top layout view 2500B of FIG. 25B, the bottom electrode layer 108 and the IMD layer 112 are patterned to form a plurality of chimney openings 2502. The patterning may, for example, be performed by a photolithography/etching process or some other suitable patterning process.

Focusing on FIG. 25A, the chimney openings 2502 extend through the bottom electrode layer 108 into the IMD layer 112. In some embodiments, a depth De of the chimney openings 2502 is greater than or equal to about 8 nanometers, about 10 nanometers, or some other suitable thickness and/or is about 8-30 nanometers, about 8-20 nanometers, or some other suitable thickness.

Focusing on FIG. 25B, the chimney openings 2502 are in a plurality of rows and a plurality of columns. In some embodiments, the chimney openings 2502 are evenly spaced from each other. In some embodiments, a diagonal width Wc of the chimney openings 2502 is greater than or equal to about 1 micrometer, 2 micrometers, or some other suitable value.

Figure 26:
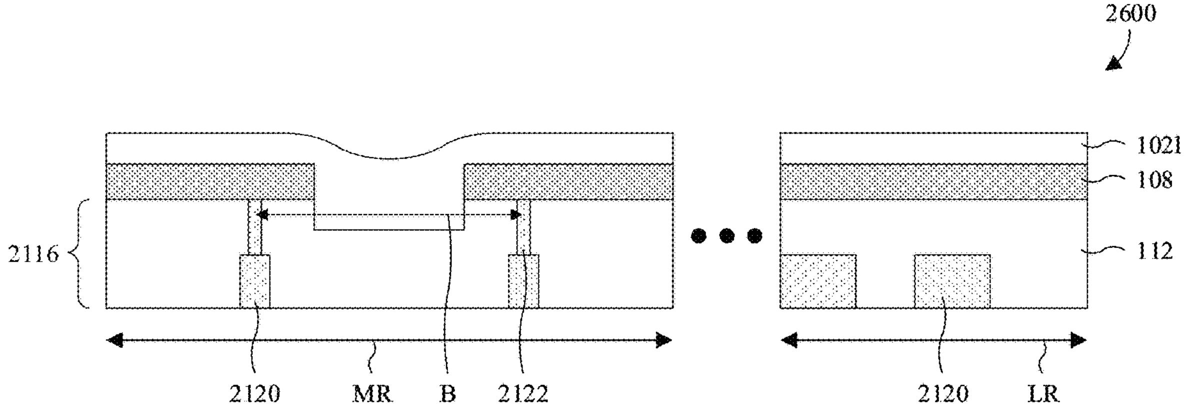

As illustrated by a cross-sectional view 2600 of FIG. 26, a seed layer 1021 is deposited covering the bottom electrode layer 108 and filling the chimney openings 2502. In some embodiments, the seed layer 1021 is deposited by atomic layer deposition (ALD), physical vapor deposition (PVD), the like, or any combination of the foregoing.

In some embodiments, the seed layer 1021 is amorphous. In some embodiments, the seed layer 1021 is or comprises perovskite, rutile, an orthorhombic thin film, or some other suitable ferroelectric material. For example, the seed layer 1021 may be or comprise hafnium zirconium oxide or the like. In some embodiments, a nitrogen doping profile along line B is as illustrated and described with regard to FIG. 3B.

Figure 27:
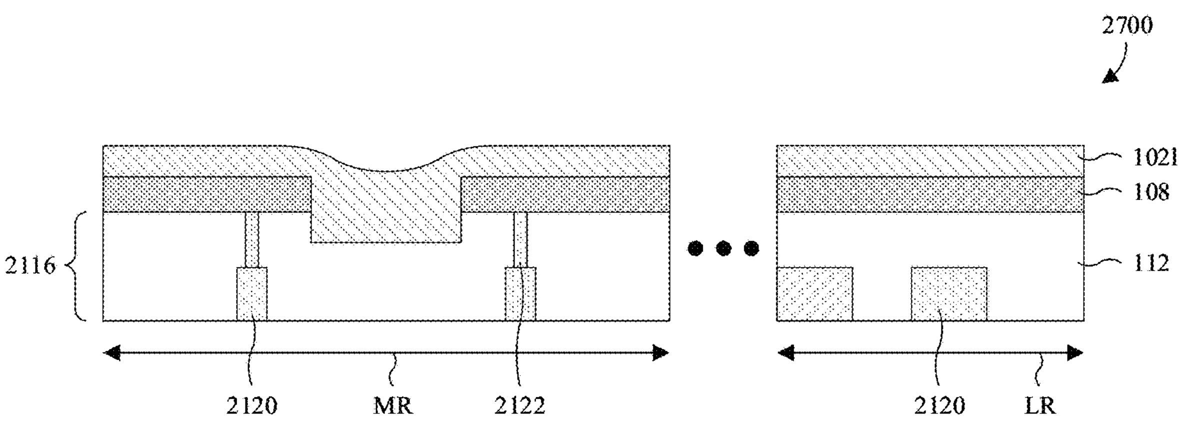

As illustrated by a cross-sectional view 2700 of FIG. 27, the seed layer 1021 is annealed to crystallize the seed layer 1021 and to grow a ferroelectric crystalline phase. This is schematically illustrated by addition of a hashing to the seed layer 1021 from FIG. 26 to FIG. 27. Low crystallinity (e.g., amorphousness) and/or low amounts of the ferroelectric crystalline phase are schematically illustrated by a lack of any hashing, whereas high amounts of the ferroelectric crystalline phase are schematically illustrated by hashing. The ferroelectric crystalline phase may, for example, correspond to the orthorhombic phase or to some other suitable phase.

Growth of a ferroelectric crystalline phase increases generally with ferroelectric thickness and conversely decreases generally with ferroelectric thickness. Because the seed layer 1021 is formed in the chimney openings 2502, it may have a larger thickness than it would otherwise have, and hence growth of the ferroelectric crystalline phase may be substantial.

Figure 28:
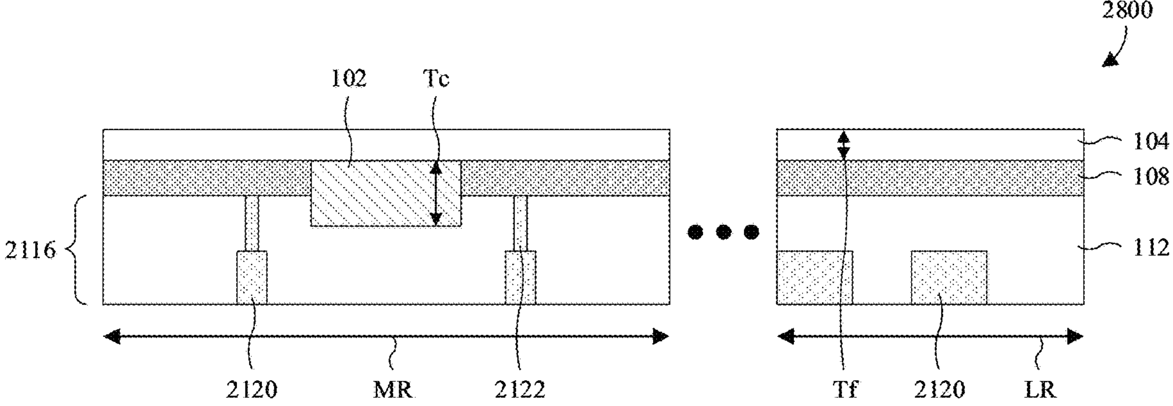

As illustrated by a cross-sectional view 2800 of FIG. 28, a planarization is performed into a top surface of the seed layer 1021 so the top surface of the seed layer 1021 is level with a top surface of the bottom electrode layer 108. The planarization forms a plurality of chimney seed structures 102 respectively in the chimney openings 2502 (see, e.g., FIGS. 25A and 25B) and may, for example, be performed by a chemical mechanical polish (CMP) or the like.

Also illustrated by a cross-sectional view 2800 of FIG. 28, a ferroelectric layer 104 is deposited covering the bottom electrode layer 108 and the chimney seed structures 102. The ferroelectric layer 104 has a thickness Tf that is small compared to a thickness Tc of the chimney seed structures 102. For example, the thickness Tf of the ferroelectric layer 104 may be less than or equal to about 4 nanometers, about 2 nanometers, or some other suitable thickness, and the thickness Tc of the chimney seed structures 102 may be greater than or equal to about 8 nanometers, about 10 nanometers, or some other suitable thickness. The ferroelectric layer 104 may, for example, be deposited by ALD, PVD, the like, or any combination of the foregoing.

In some embodiments, the ferroelectric layer 104 is or comprises perovskite, rutile, an orthorhombic thin film, or some other suitable ferroelectric material. For example, the ferroelectric layer 104 may be or comprise hafnium zirconium oxide or the like. In some embodiments, the ferroelectric layer 104 is nitrogen doped. The nitrogen doping may, for example, have a non-zero atomic percentage of less than or equal to about 5%, 3%, or some other suitable percentage and/or may, for example, have a non-zero atomic percentage of about 0.1-5%, about 0.1-2.5%, about 2.5-5.0%, or some other suitable percentage. In some embodiments, the ferroelectric layer 104 is amorphous.

Figure 29:
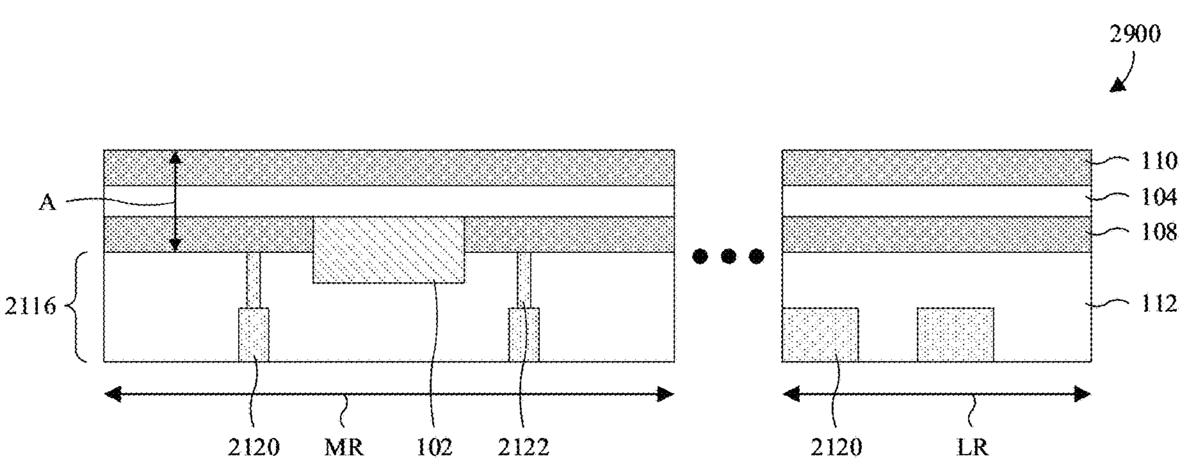

As illustrated by a cross-sectional view 2900 of FIG. 29, a top electrode layer 110 is deposited on the ferroelectric layer 104. In some embodiments, the top electrode layer 110 and the bottom electrode layer 108 are the same material. In other embodiments, the top electrode layer 110 and the bottom electrode layer 108 are different materials.

In some embodiments, the top electrode layer 110 is conductive. For example, the top electrode layer 110 may be or comprise a pure metal, a refractory metal nitride, a conductive oxide, or some other suitable material. In some embodiments, the top electrode layer 110 is semiconductive. For example, the top electrode layer 110 may be or comprise a single crystalline or polycrystalline semiconductor material that is doped. In some embodiments, the semiconductor material has a bandgap less than about 2 or some other suitable value. Further, in some embodiments, the semiconductor material is or comprises silicon, germanium, ITO, or some other suitable material.

In some embodiments, the top electrode layer 110 is nitrogen doped. The nitrogen doping may, for example, have an atomic percentage greater than or equal to about 50%, about 60%, or some other suitable percentage. In some embodiments, a nitrogen doping profile along line A is as illustrated and described with regard to FIG. 3A.

In some embodiments, the top electrode layer 110 is semiconductive, whereas the bottom electrode layer 108 is metal. In at least some of such embodiments, the top electrode layer 110, the ferroelectric layer 104, and the bottom electrode layer 108 may have band diagrams as in FIGS. 4A and 4B. In other embodiments, the top electrode layer 110 is metal, whereas the bottom electrode layer 108 is semiconductive. In at least some of such embodiments, the top electrode layer 110, the ferroelectric layer 104, and the bottom electrode layer 108 may have band diagrams as in FIGS. 5A and 5B. In some embodiments, the band diagrams are taken along line A in FIG. 29.

In some embodiments, the bottom electrode layer 108, the ferroelectric layer 104, and the top electrode layer 110 form a MFM structure. In other embodiments, the bottom electrode layer 108, the ferroelectric layer 104, and the top electrode layer 110 form a MFS structure. In yet other embodiments, the bottom electrode layer 108, the ferroelectric layer 104, and the top electrode layer 110 form a SFM structure.

As illustrated by the views of FIGS. 30A and 30B to FIGS. 32A and 32B, the chimney seed structures 102 undergo laser annealing by one or more laser devices 3002. Each of the one or more laser devices 3002 generates a laser beam 3004 that is directed at a corresponding chimney seed structure 102 to heat that chimney seed structure 102.

In some embodiments, the one or more laser devices 3002 is a single laser device that steps across the ferroelectric layer 104 to heat the chimney seed structures 102 one at a time. In other embodiments, the one or more laser devices 3002 has multiple laser devices, one for each of the chimney seed structures 102. Further, the chimney seed structures 102 are heated in parallel. In yet other embodiments, the chimney seed structures 102 are grouped into a plurality of like-sized groups and the one or more laser devices 3002 has multiple laser devices, one for each chimney seed structure of a group. Further, the multiple laser devices are stepped across the ferroelectric layer 104 to heat the groups one at a time.

The laser annealing grows the ferroelectric crystalline phase in the chimney seed structures 102 and the ferroelectric layer 104. Low amounts of crystallinity (e.g., amorphousness) are schematically illustrated by the lack of any hashing, whereas high amounts of the ferroelectric crystalline phase are schematically illustrated by hashing. Laser annealing is employed instead of other types of annealing because it is more localized. As such, it is less likely to damage the access transistors 2102 and the logic transistors 2104. Further, higher temperatures may be reached. The higher temperatures allow enhanced growth of the ferroelectric crystalline phase. The ferroelectric crystalline phase may, for example, correspond to the orthorhombic phase or to some other suitable phase.

Growth of the ferroelectric crystalline phase increases generally with ferroelectric thickness and conversely decreases generally with ferroelectric thickness. Because of the large thickness, the chimney seed structures 102 have a large amount of growth of the ferroelectric crystalline phase during the laser annealing. This seeds growth of the ferroelectric crystalline phase at the ferroelectric layer 104, which hereafter accommodates memory cells.

Figure 30A:
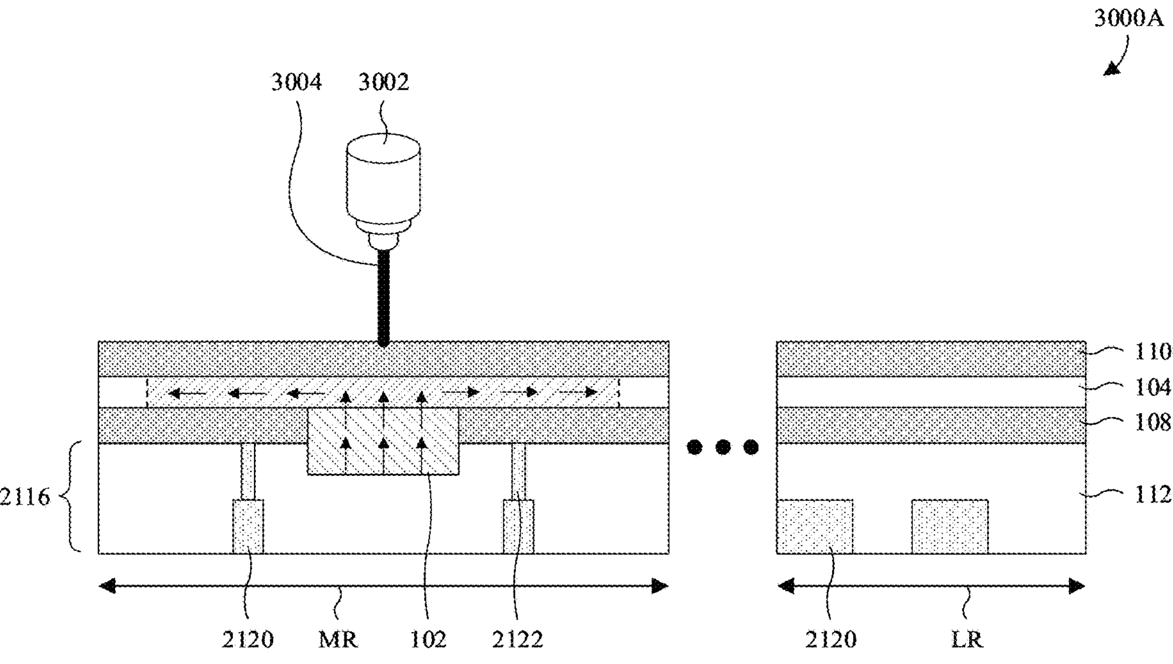
Figure 30B:
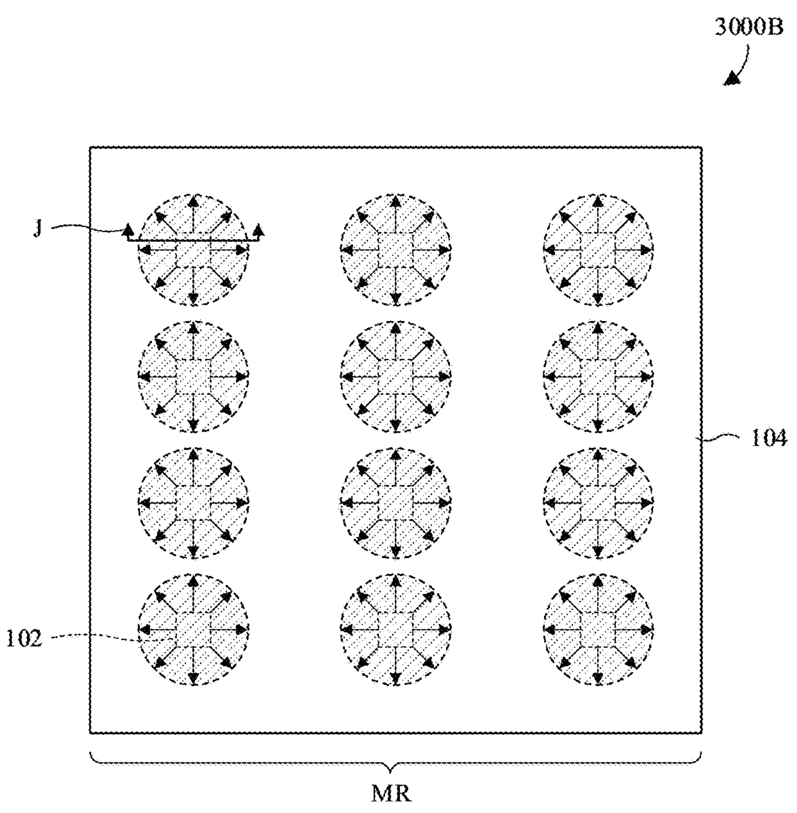
Figure 31A:
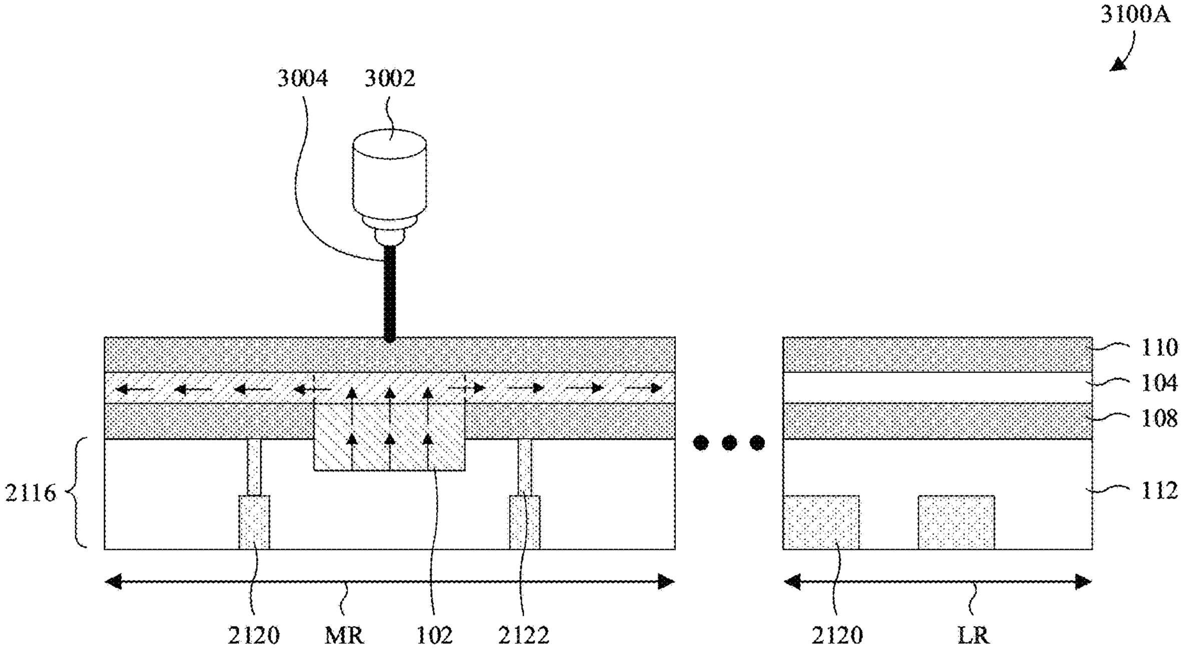
Figure 31B:
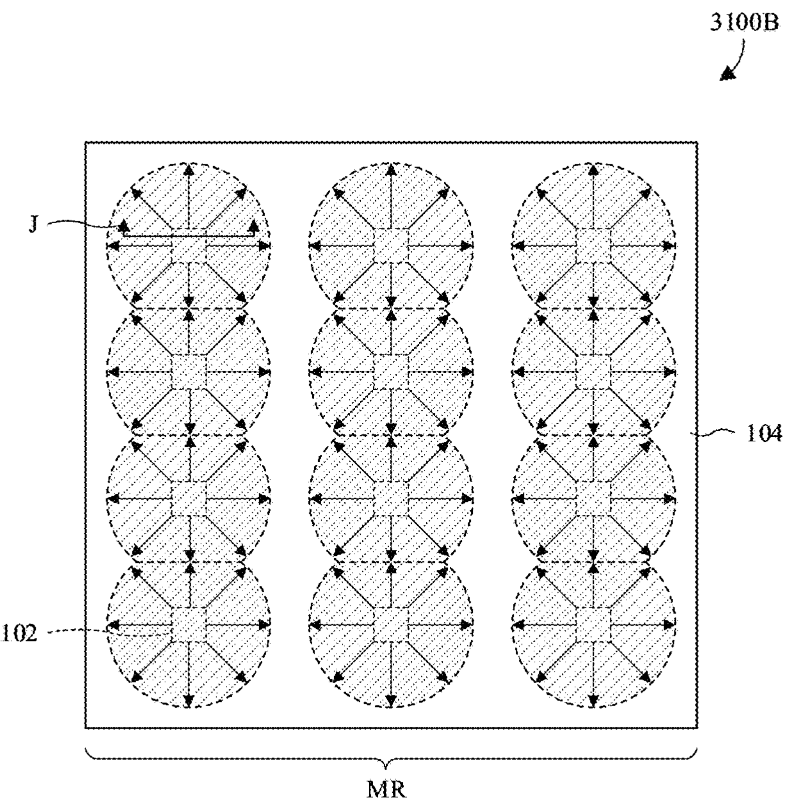
Figure 32A:
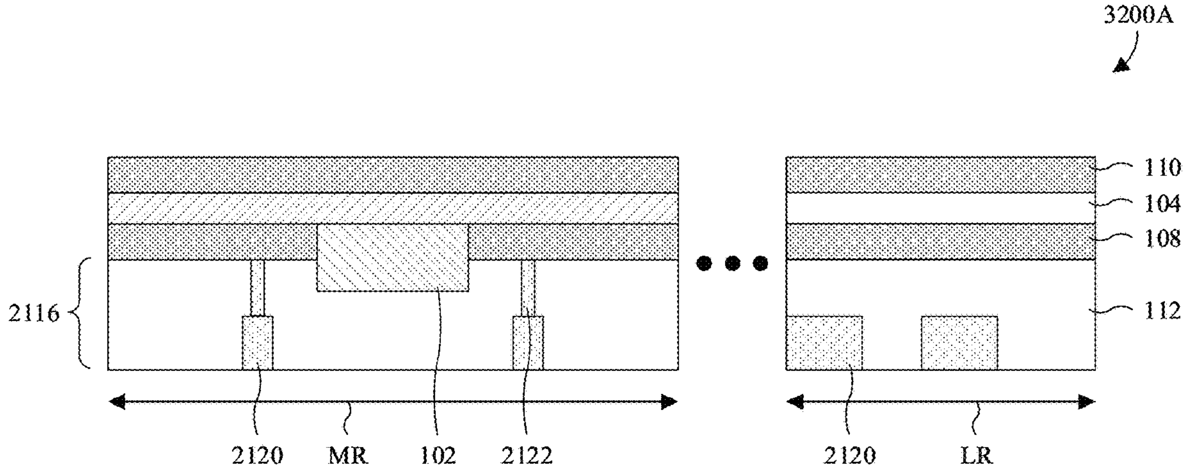
Figure 32B:
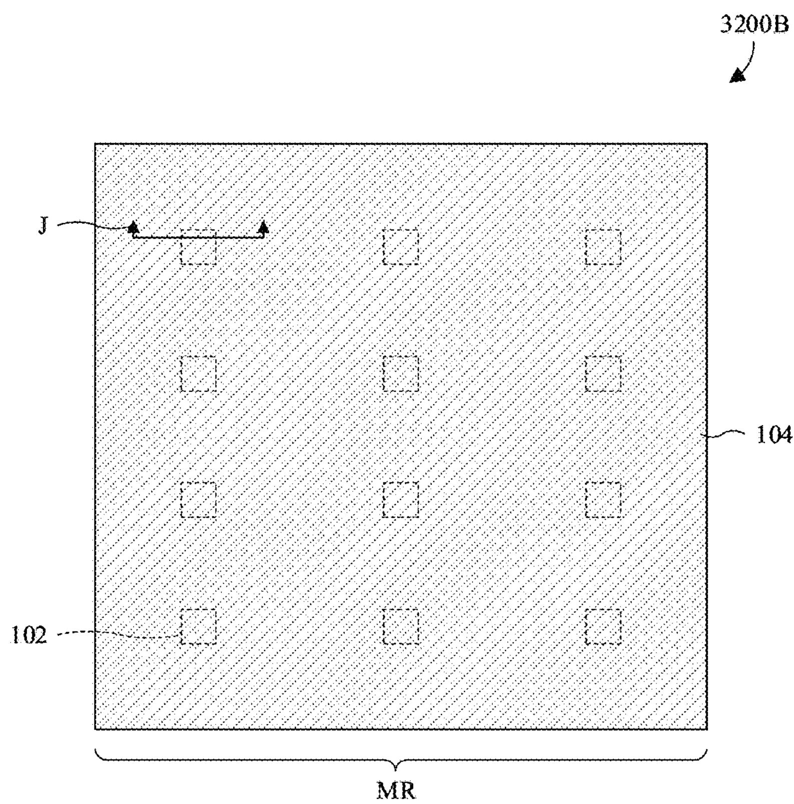

Focusing on the cross-sectional view 3000A of FIG. 30A, and the top layout view 3000B of FIG. 30B, the ferroelectric crystalline phase grows vertically along thicknesses of the chimney seed structures 102 and further grows laterally outward from the chimney seed structures 102 into the ferroelectric layer 104. Focusing on the cross-sectional view 3100A of FIG. 31A, and the top layout view 3100B of FIG. 31B, the growth continues growing laterally outward from the chimney seed structures 102. Further, the growth from different chimney seed structures 102 merges between the chimney seed structures 102. Focusing on the cross-sectional view 3200A of FIG. 32A, and the top layout view 3200B of FIG. 32B, the laser annealing concludes, and the growth blankets the memory region MR.

Because the ferroelectric crystalline phase grows into the ferroelectric layer 104 from the chimney seed structures 102, the chimney seed structures 102 seed ferroelectric crystalline growth at the ferroelectric layer 104. Further, the ferroelectric layer 104 may have a large remnant polarization despite having a small thickness. Because the ferroelectric layer 104 may have a large remnant polarization, memory cells hereafter formed may have large read windows. Hence, the likelihood of data corruption and misreads is low and reliability is enhanced. Because the ferroelectric layer 104 has the small thickness, the memory cells may have large read currents. Hence, remanent polarization states of the memory cells may be quickly read.

Because the ferroelectric crystalline phase grows into the ferroelectric layer 104 from the chimney seed structures 102, ferroelectric thickness at the memory cells is essentially decoupled from growth of the ferroelectric crystalline phase at the memory cells. As such, the ferroelectric memory device may be scaled down more than would otherwise be possible while maintaining good performance and reliable operation.

As noted above, the IMD layer 112, the ferroelectric layer 104, the bottom electrode layer 108, and the top electrode layer 110 may be nitrogen doped. The nitrogen doping of the ferroelectric layer 104 lowers the bandgap, thereby increasing read current through the memory cells hereafter formed. Increased read current leads to faster read times. The nitrogen doping of the bottom electrode layer 108 and the nitrogen doping of the top electrode layer 110 reduce the oxygen scavenge effect, thereby reducing defects and improving electric field uniformity across the ferroelectric layer 104 during use of the memory cells. The nitrogen doping of the IMD layer 112 reduces surface energy of the chimney seed structures 102 at an interface at which the IMD layer 112 and the chimney seed structures 102 directly contact. The reduced surface energy enhances growth of the ferroelectric crystalline phase.

Figure 33A:
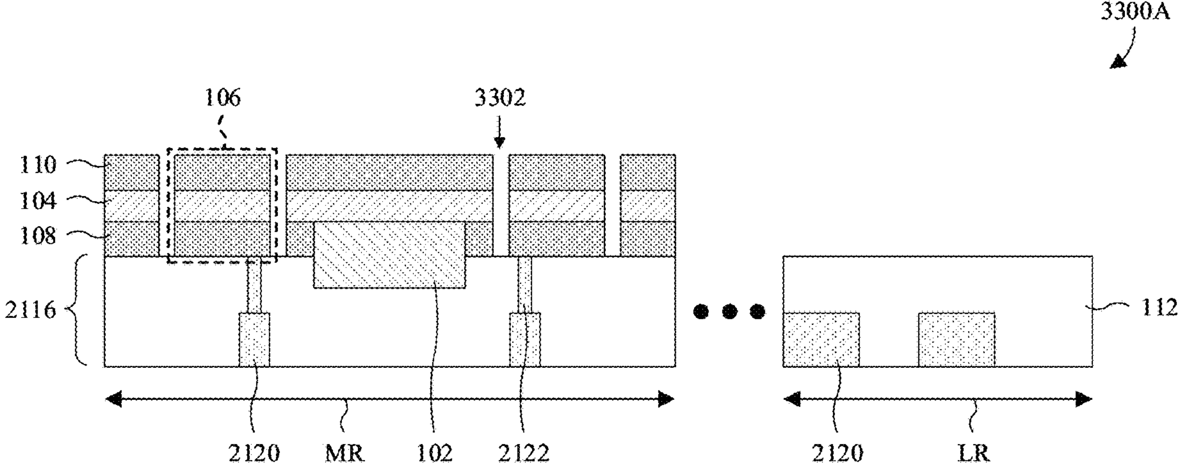
Figure 33B:
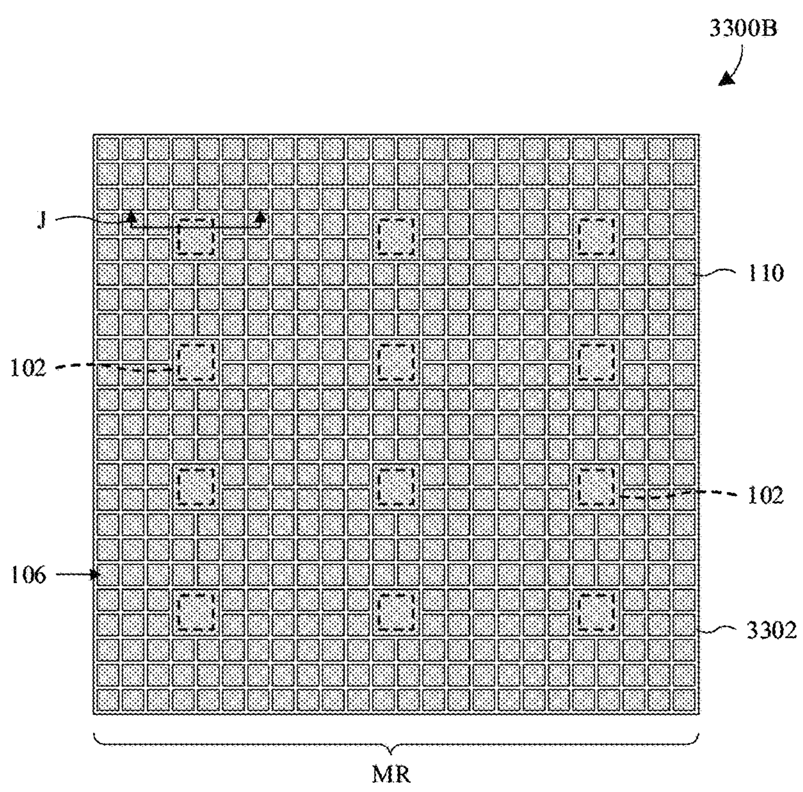

As illustrated by a cross-sectional view 3300A of FIG. 33A, and a top layout view 3300B of FIG. 33B, the bottom electrode layer 108, the ferroelectric layer 104, and the top electrode layer 110 are patterned to form a trench 3302 at the memory region MR. The trench 3302 demarcates individual memory cells 106 and, in some embodiments, has a grid-shaped top layout. Other suitable top layouts are, however, amenable. The patterning may, for example, be performed by a photolithography/etching process or some other suitable patterning process.

In alternative embodiments, the trench 3302 extends through the top electrode layer 110 and the ferroelectric layer 104 but does not extend through the bottom electrode layer 108. Instead, the trench 3302 stops at a top of the bottom electrode layer 108. FIG. 12 provides a non-limiting example. In alternative embodiments, the trench 3302 extends through the top electrode layer 110 but does not extend through the bottom electrode layer 108 and the ferroelectric layer 104. Instead, the trench 3302 stops at a top of the ferroelectric layer 104. FIG. 14 provides a non-limiting example.

Also illustrated by the cross-sectional view 3300A of FIG. 33A, and the top layout view 3300B of FIG. 33B, the bottom electrode layer 108, the ferroelectric layer 104, and the top electrode layer 110 are patterned to remove portions thereof from the logic region LR. The patterning may, for example, be performed by a photolithography/etching process or some other suitable patterning process. In some embodiments, the patterning to remove the portions of the bottom electrode layer 108, the ferroelectric layer 104, and the top electrode layer 110 and the patterning to form the trench 3302 are performed by a common etch.

Figure 34:
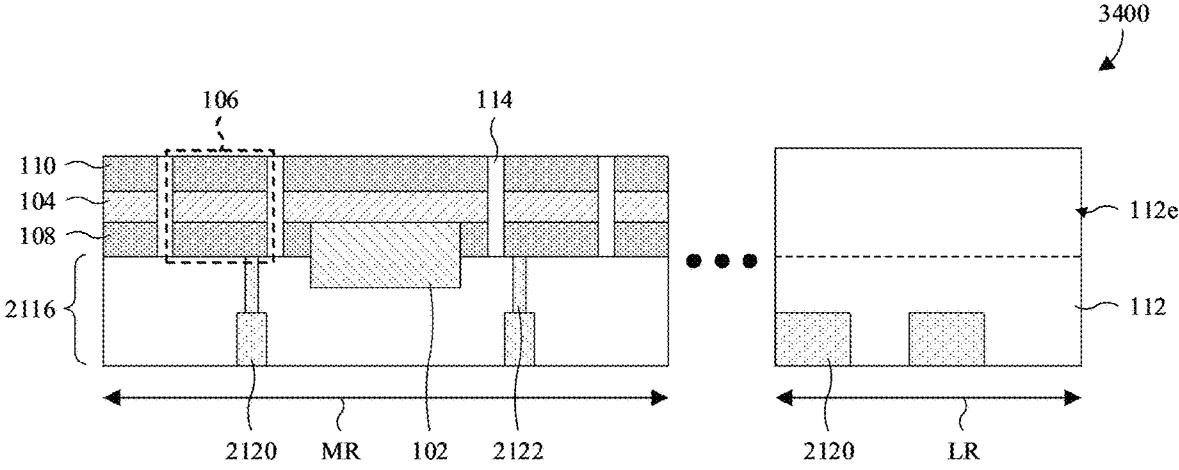

As illustrated by a cross-sectional view 3400 of FIG. 34, the IMD layer 112 is extended to an elevation level with a top surface of the top electrode layer 110. Further, a dielectric wall 114 is formed filling the trench 3302 (see, e.g., FIG.

33A). The dielectric wall 114 separates the memory cells 106 and the chimney seed structures 102 from each other.

A process for extending the IMD layer 112 and forming the dielectric wall 114 may, for example, comprise: 1) depositing dielectric material covering the memory region MR and the logic region LR and further filling the trench 3302; and 2) performing a planarization into the dielectric material to a top surface of the top electrode layer 110. Other suitable processes are, however, amenable. A portion of the dielectric material in the trench 3302 corresponds to the dielectric wall 114, whereas a remainder of the dielectric material outside the trench 3302 corresponds to the extension 112*e* of the IMD layer 112.

Figure 35:
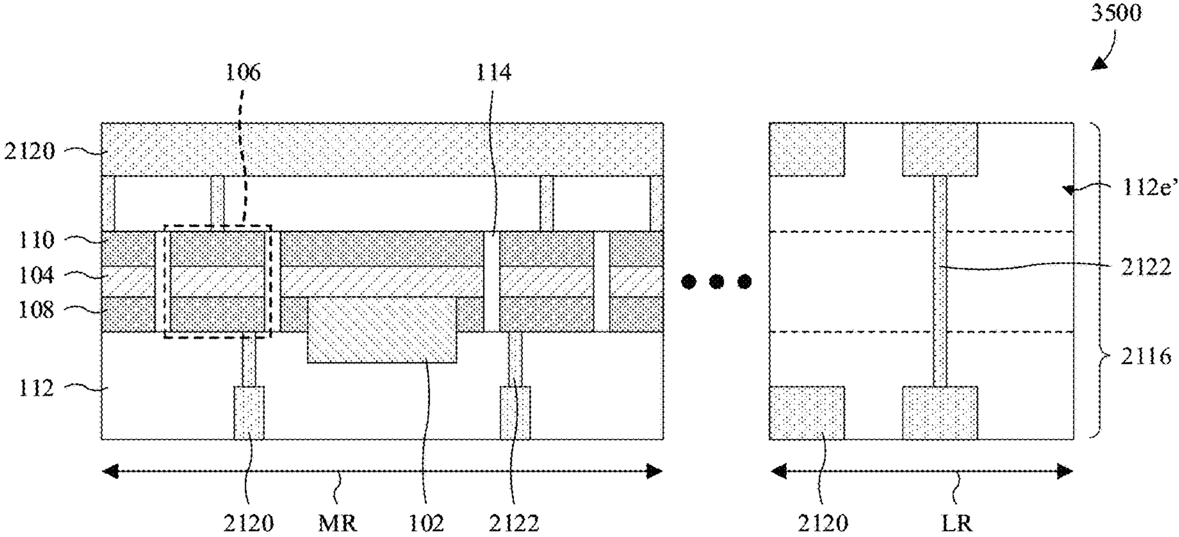

As illustrated by a cross-sectional view 3500 of FIG. 35, the interconnect structure 2116 is completed over the memory cells 106. This includes further extending the IMD layer 112 to an elevation over a top surface of the top electrode layer 110 and forming additional wires 2120 and additional vias 2122 in the further extension 112*e*' of the IMD layer 112.

A process for completing the interconnect structure 2116 may, for example, comprise: 1) depositing dielectric material covering the memory region MR and the logic region LR; 2) patterning the dielectric material to form via and wire openings; and 3) filling the via and wire openings with conductive material. Other suitable processes are, however, amenable. The dielectric material corresponds to the further extension 112*e*' of the IMD layer 112, whereas the conductive material corresponds to the additional wires 2120 and the additional vias 2122.

While FIGS. 22-24, 25A and 25B, 26-29, 30A and 30B to 33A and 33B, 34, and 35 are described with reference to a method, it will be appreciated that the structures shown in these figures are not limited to the method but rather may stand alone separate of the method. While FIGS. 22-24, 25A and 25B, 26-29, 30A and 30B to 33A and 33B, 34, and 35 are described as a series of acts, it will be appreciated that the order of the acts may be altered in other embodiments. While FIGS. 22-24, 25A and 25B, 26-29, 30A and 30B to 33A and 33B, 34, and 35 illustrate and describe as a specific set of acts, some acts that are illustrated and/or described may be omitted in other embodiments. Further, acts that are not illustrated and/or described may be included in other embodiments.

Figure 36:
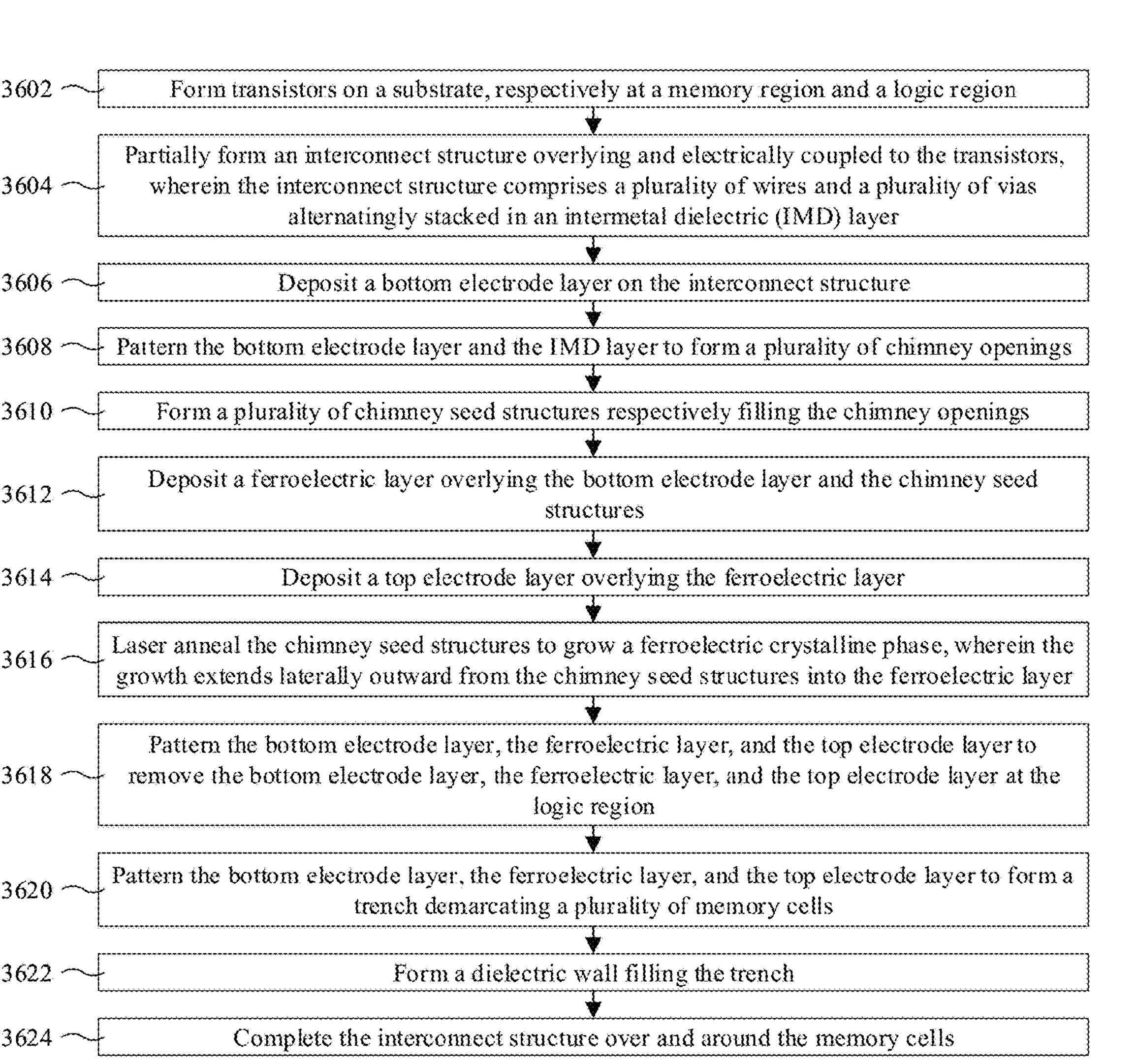
FIG. 36 illustrates a block diagram of some embodiments of the method of FIGS. 22-24, 25A and 25B, 26-29, 30A and 30B to 33A and 33B, 34, and 35.

With reference to FIG. 36, a block diagram 3600 of some embodiments of the method of FIGS. 22-24, 25A and 25B, 26-29, 30A and 30B to 33A and 33B, 34, and 35 is provided.

At 3602, transistors are formed on a substrate, respectively at a memory region and a logic region. See, for example, FIG. 22.

At 3604, an interconnect structure is partially formed overlying and electrically coupled to the transistors, wherein the interconnect structure comprises a plurality of wires and a plurality of vias alternatingly stacked in an IMD layer. See, for example, FIG. 23.

At 3606, a bottom electrode layer is deposited on the interconnect structure. See, for example, FIG. 24.

At 3608, the bottom electrode layer and the IMD layer are patterned to form a plurality of chimney openings. See, for example, FIGS. 25A and 25B.

At 3610, a plurality of chimney seed structures are formed respectively filling the chimney openings. See, for example, FIGS. 26-28.

At 3612, a ferroelectric layer is deposited overlying the bottom electrode layer and the chimney seed structures. See, for example, FIG. 28.

At 3614, a top electrode layer is deposited overlying the ferroelectric layer. See, for example, FIG. 29.

At 3616, the chimney seed structures are laser annealed to grow a ferroelectric crystalline phase, wherein the growth extends laterally outward from the chimney seed structures into the ferroelectric layer. See, for example, FIGS. 30A and 30B to FIGS. 32A and 32B.

At 3618, the bottom electrode layer, the ferroelectric layer, and the top electrode layer are patterned to remove the bottom electrode layer, the ferroelectric layer, and the top electrode layer at the logic region. See, for example, FIGS. 33A and 33B.

At 3620, the bottom electrode layer, the ferroelectric layer, and the top electrode layer are patterned to form a trench demarcating a plurality of memory cells. See, for example, FIGS. 33A and 33B.

At 3622, a dielectric wall is formed filling the trench. See, for example, FIG. 34.

At 3624, the interconnect structure is completed over around the memory cells. See, for example, FIG. 35.

While the block diagram 3600 of FIG. 36 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 37:
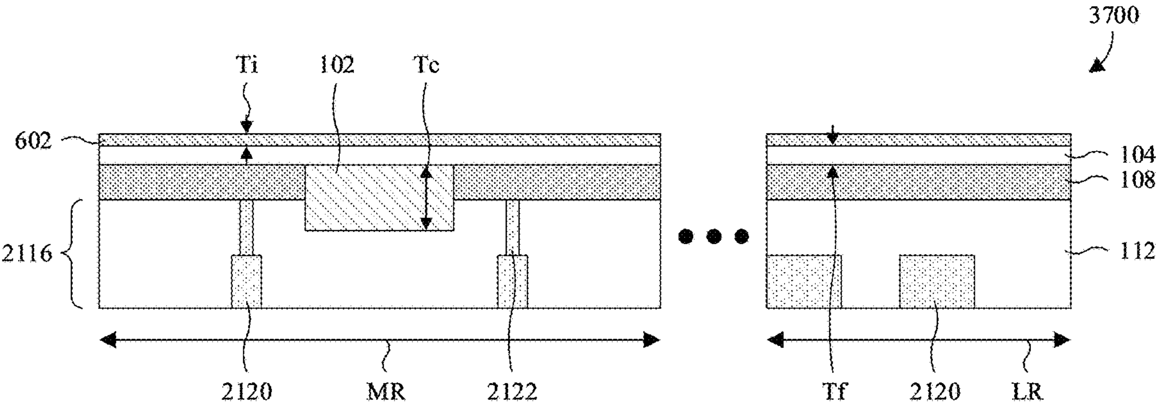
FIGS. 37 and 38 illustrate a series of cross-sectional views of some alternative embodiments of the method of FIGS. 22-24, 25A and 25B, 26-29, 30A and 30B to 33A and 33B, 34, and 35 in which an interfacial layer is formed atop a ferroelectric layer.
Figure 38:
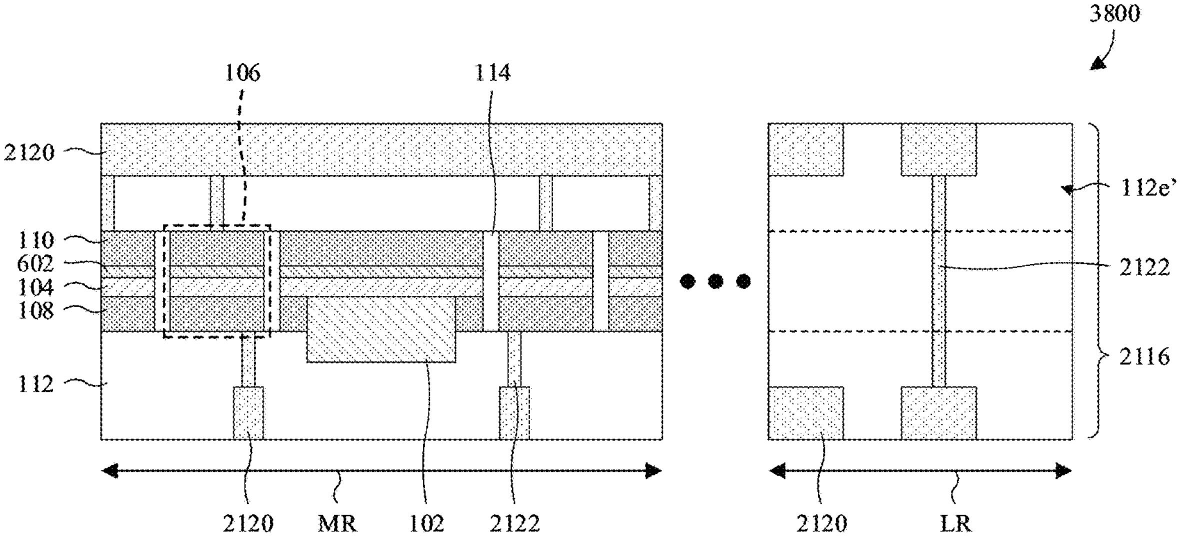

With reference to FIGS. 37 and 38, a series of cross-sectional views 3700, 3800 of some alternative embodiments of the method of FIGS. 22-24, 25A and 25B. 26-29, 30A and 30B to 33A and 33B, 34, and 35 is provided in which an interfacial layer 602 is formed atop the ferroelectric layer 104. A non-limiting example of this is at FIG. 6.

As illustrated by a cross-sectional view 3700 of FIG. 37, the acts described with regard to FIGS. 22-24, 25A and 25B, and 26-28 are performed as described above. Such acts form the access and logic transistors 2102, 2104, partially form the interconnect structure 2116, deposit the bottom electrode layer 108, and form the chimney openings 2502. Further, such acts form the chimney seed structures 102 and deposit the ferroelectric layer 104. Other suitable acts are, however, amenable in alternative embodiments.

Also illustrated by the cross-sectional view 3700 of FIG. 37, an interfacial layer 602 is deposited overlying the ferroelectric layer 104. The interfacial layer 602 is dielectric and may, for example, be as described with regard to FIG. 6.

In some embodiments, the interfacial layer 602 has a dielectric constant greater than about 3 or some other suitable value and/or is or comprises an oxynitride, a nitride, or some other suitable material. For example, the interfacial layer 602 may be or comprise silicon oxynitride (e.g., SiON), aluminum oxynitride (e.g., AlON), titanium oxynitride (e.g., TiON), tantalum oxynitride (e.g., TaON), hafnium oxynitride (e.g., HfON), hafnium nitride (e.g., $Hf_3N_4$), some other suitable material(s), or any combination of the foregoing. In some embodiments, a thickness Ti of the interfacial layer 602 is less than about 2 nanometers, about 1 nanometer, or some other suitable value and/or is about 0.1-2 nanometers, about 0.1-1 nanometers, about 1-2 nanometers, or some other suitable value.

In some embodiments, the interfacial layer 602 is nitrogen doped. The nitrogen doping lowers surface energy of the ferroelectric layer 104 along an interface at which the interfacial layer 602 and the ferroelectric layer 104 directly contact. The lower surface energy enhances growth of the ferroelectric crystalline phase and stabilizes the ferroelectric crystalline phase to enhance remanent polarization.

As illustrated by a cross-sectional view 3800 of FIG. 38, the acts described with regard to FIGS. 29, 30A and 30B to 33A and 33B, 34, and 35 are performed as described above. Such acts deposit the top electrode layer 110, laser anneal the chimney seed structures 102, and clear the logic region LR of the top electrode layer 110, the bottom electrode layer 108, and the ferroelectric layer 104. Further, such acts form the trench 3302, form the dielectric wall 114 in the trench 3302, and complete the interconnect structure 2116. Other suitable acts are, however, amenable in alternative embodiments.

While FIGS. 37 and 38 are described with reference to a method, it will be appreciated that the structures shown in these figures are not limited to the method but rather may stand alone separate of the method. While FIGS. 37 and 38 are described as a series of acts, it will be appreciated that the order of the acts may be altered in other embodiments. While FIGS. 37 and 38 illustrate and describe as a specific set of acts, some acts that are illustrated and/or described may be omitted in other embodiments. Further, acts that are not illustrated and/or described may be included in other embodiments.

Figure 39:
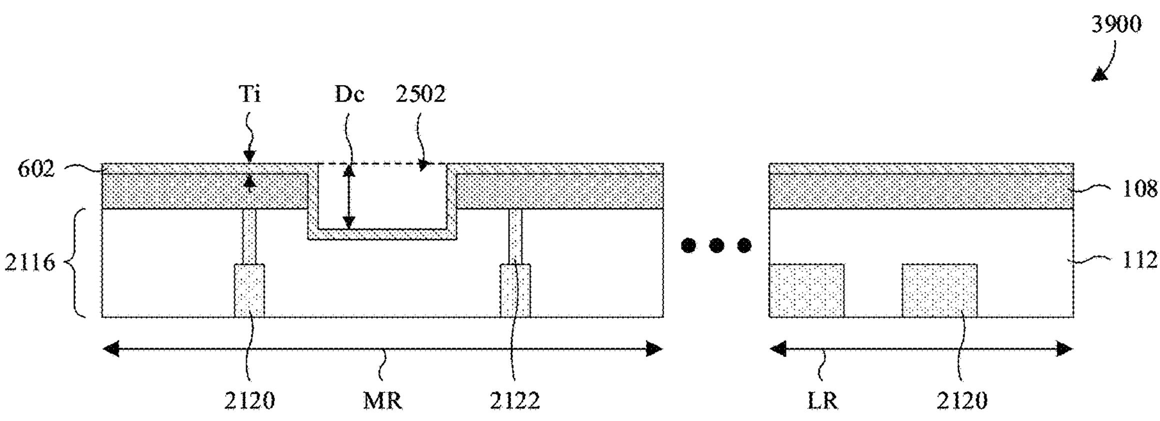
FIGS. 39 and 40 illustrate a series of cross-sectional views of some alternative embodiments of the method of FIGS. 22-24, 25A and 25B, 26-29, 30A and 30B to 33A and 33B. 34, and 35 in which a ferroelectric layer is formed atop an interfacial layer.
Figure 40:
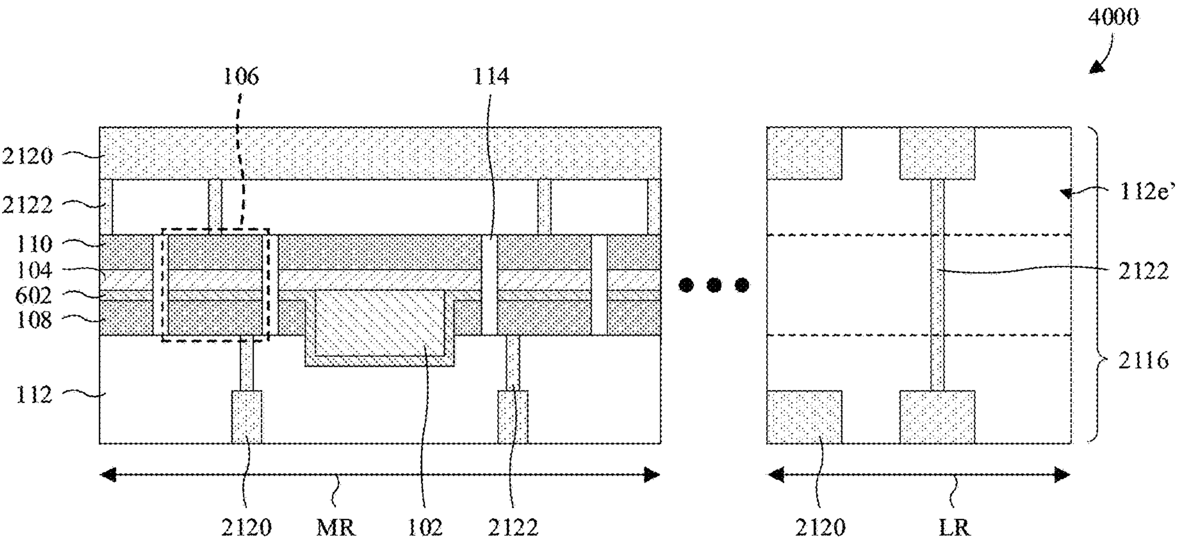

With reference to FIGS. 39 and 40, a series of cross-sectional views 3900, 4000 of some alternative embodiments of the method of FIGS. 22-24, 25A and 25B, 26-29, 30A and 30B to 33A and 33B, 34, and 35 is provided in which the ferroelectric layer 104 is formed atop the interfacial layer 602. A non-limiting example of this is at FIG. 9.

As illustrated by a cross-sectional view 3900 of FIG. 39, the acts described with regard to FIGS. 22-24 and 25A and 25B are performed as described above. Such acts form the access and logic transistors 2102, 2104 and partially form the interconnect structure 2116. Such acts also deposit the bottom electrode layer 108 and form the chimney openings 2502. Other suitable acts are, however, amenable in alternative embodiments.

Also illustrated by the cross-sectional view 3900 of FIG. 39, an interfacial layer 602 is deposited overlying the bottom electrode layer 108 and lining the chimney openings 2502. The interfacial layer 602 may, for example, be as described with regard to FIG. 9 and/or may, for example, be as described with regard to FIG. 37.

As illustrated by a cross-sectional view 4000 of FIG. 40, the acts described with regard to FIGS. 26-29, 30A and 30B to 33A and 33B, 34, and 35 are performed as described above. Such acts form the chimney seed structures 102, deposit the ferroelectric layer 104 and the top electrode layer 110, and laser anneal the chimney seed structures 102. Further, such acts clear the logic region LR of the top electrode layer 110, the bottom electrode layer 108, and the ferroelectric layer 104, form the trench 3302, form the dielectric wall 114 in the trench 3302, and complete the interconnect structure 2116. Other suitable acts are, however, amenable in alternative embodiments.

While FIGS. 39 and 40 are described with reference to a method, it will be appreciated that the structures shown in these figures are not limited to the method but rather may stand alone separate of the method. While FIGS. 39 and 40 are described as a series of acts, it will be appreciated that the order of the acts may be altered in other embodiments. While FIGS. 39 and 40 illustrate and describe as a specific set of acts, some acts that are illustrated and/or described may be omitted in other embodiments. Further, acts that are not illustrated and/or described may be included in other embodiments.

With reference to FIGS. 41, 42A and 42B, 43, 44A and 44B, and 45, a series of views of some alternative embodiments of the method of FIGS. 22-24, 25A and 25B, 26-29, 30A and 30B to 33A and 33B, 34, and 35 is provided in which a dielectric wall is formed overlapping with the chimney seed structures. Figure numbers suffixed with "A" or no letter correspond to cross-sectional views, whereas figure numbers suffixed with "B" correspond to top layout views of memory regions MR in like numbered figures suffixed with "A". Further, cross-sectional portions of the memory regions MR illustrated in figures suffixed with "A" may be taken along line K in like numbered figures suffixed with "B". The ferroelectric memory device may, for example, be configured according to the embodiments of FIG. 18.

Figure 41:
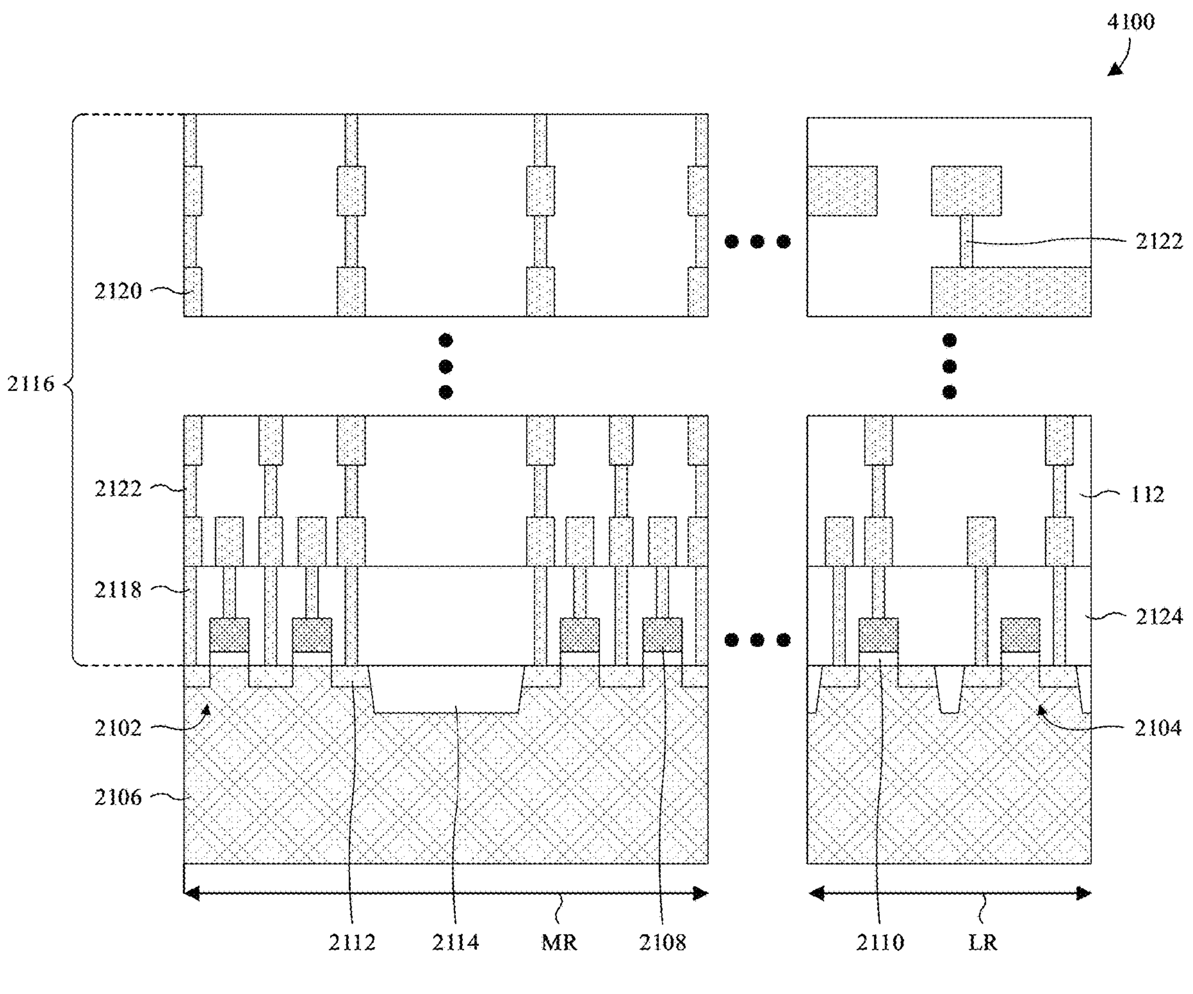
FIGS. 41, 42A and 42B, 43, 44A and 44B, and 45 illustrate a series of views of some alternative embodiments of the method of FIGS. 22-24, 25A and 25B, 26-29, 30A and 30B to 33A and 33B, 34, and 35 in which a dielectric wall is formed overlapping with the chimney seed structure.

As illustrated by a cross-sectional view 4100 of FIG. 41, the acts described with regard to FIGS. 22 and 23 are performed. Such acts form the access and logic transistors 2102, 2104 and partially form the interconnect structure 2116. The resulting structure is similar to the structure of FIG. 23. However, the access transistors 2102 have a different layout. Further, the wires 2120 and the vias 2122 have a different layout at the memory region MR. In alternative embodiments, other suitable acts are performed.

Figure 42A:
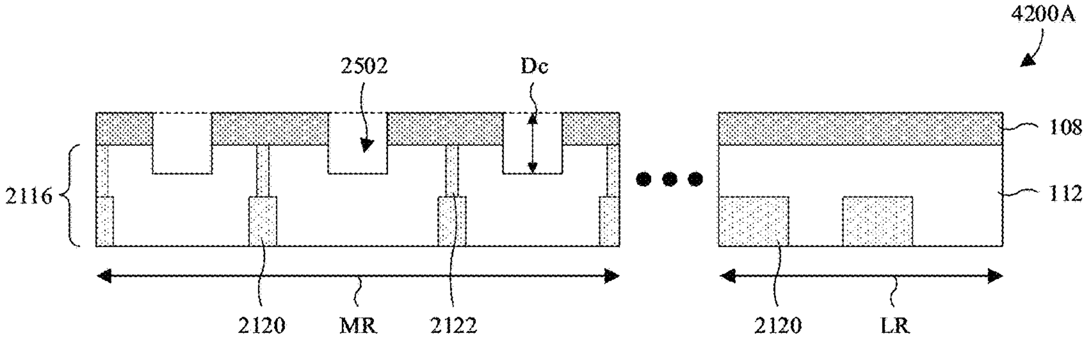
Figure 42B:
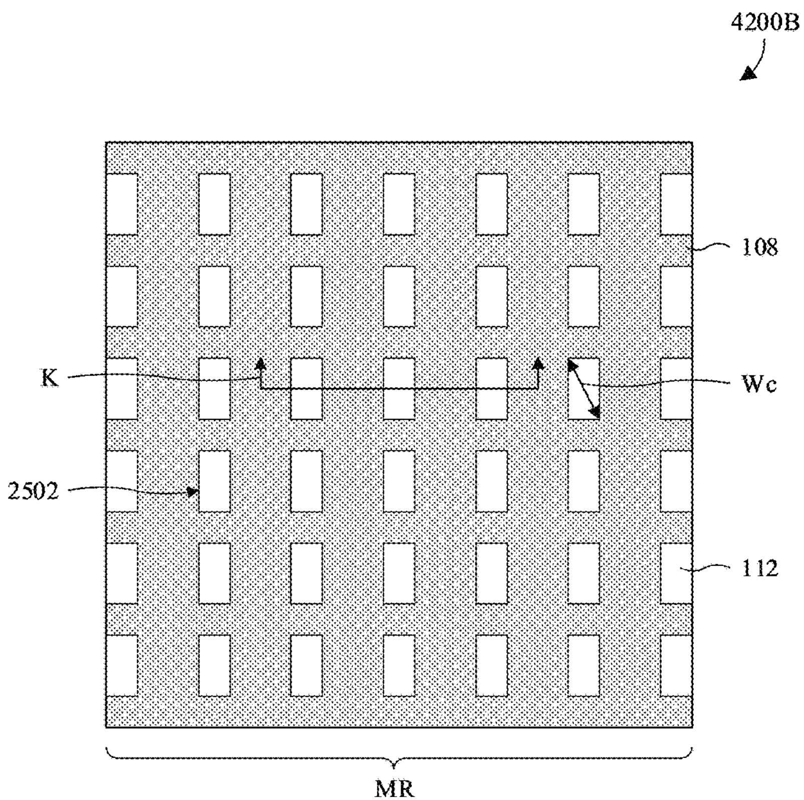

As illustrated by a cross-sectional view 4200A of FIG. 42A, and a top layout view 4200B of FIG. 42B, the acts described with regard to FIGS. 24, 25A and 25B are performed. Such acts deposit the bottom electrode layer 108 and form the chimney openings 2502. For clarity, a lower portion of the structure formed up to FIG. 41 is hereafter omitted. However, it is to be appreciated that the lower portion persists hereafter even though not shown. In alternative embodiments, other suitable acts are performed.

Figure 43:
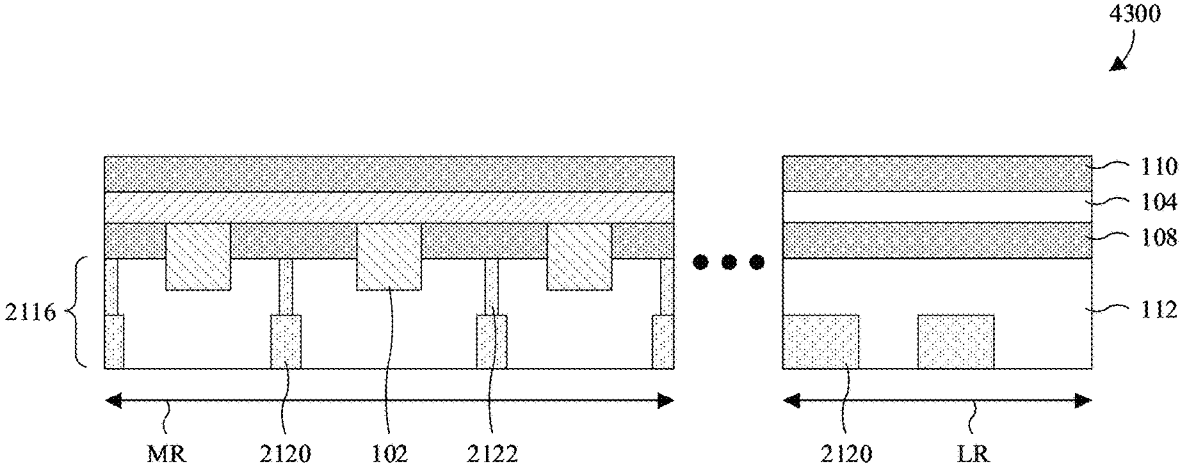

As illustrated by a cross-sectional view 4300 of FIG. 43, the acts described with regard to FIGS. 26-29 and 30A and 30B to 32A and 32B are performed. Such acts form the chimney seed structures 102, deposit the ferroelectric layer 104 and the top electrode layer 110, and laser anneal the chimney seed structures 102 to grow the ferroelectric crystalline phase. In alternative embodiments, other suitable acts are performed.

Figure 44A:
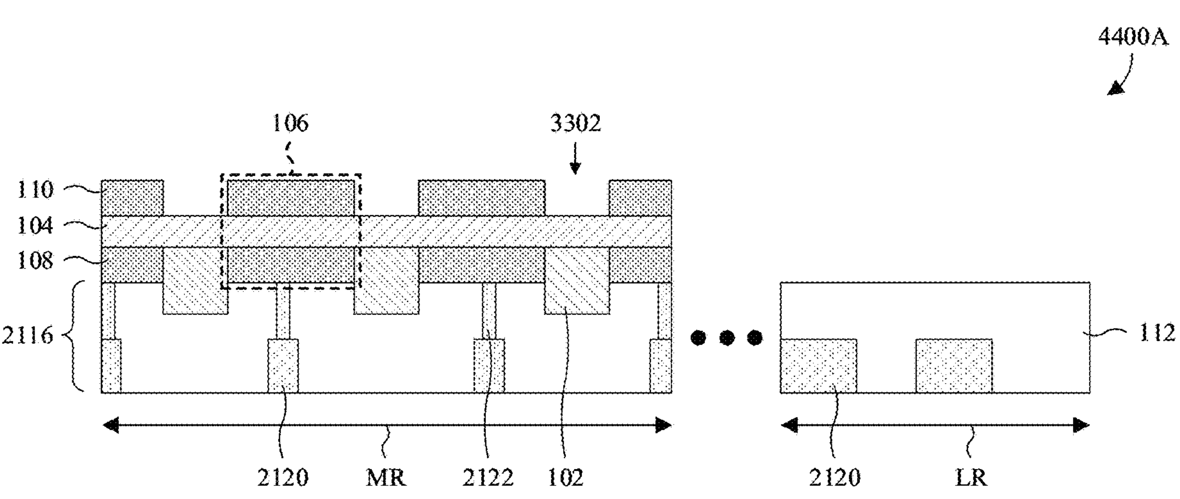
Figure 44B:
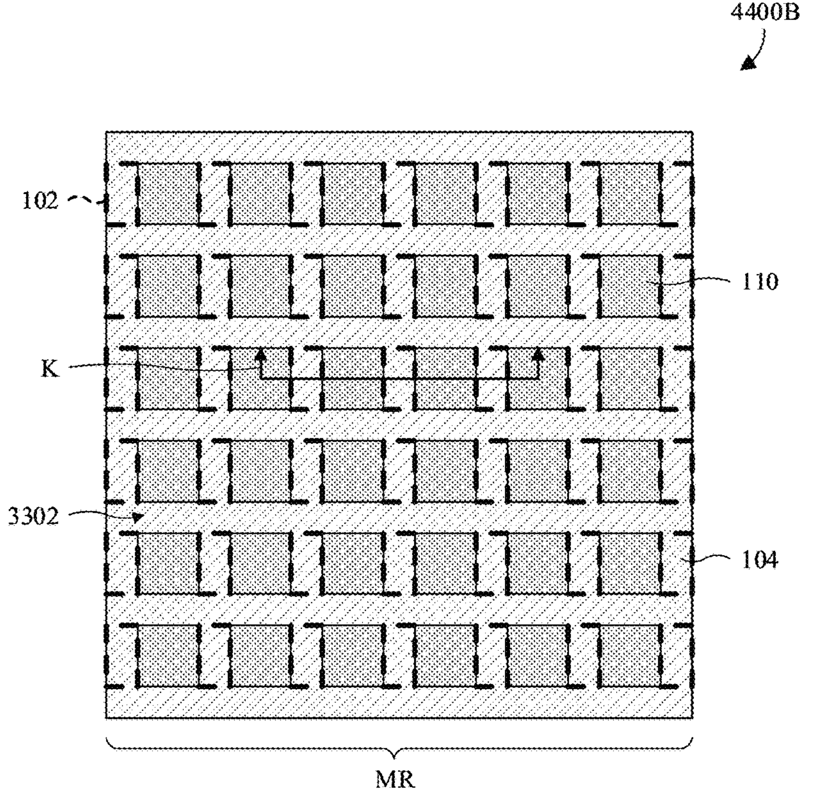

As illustrated by a cross-sectional view 4400A of FIG. 44A, and a top layout view 4400B of FIG. 44B, the acts described with regard to FIGS. 33A and 33B are performed. Such acts clear the logic region LR of the top electrode layer 110, the bottom electrode layer 108, and the ferroelectric layer 104 and further form the trench 3302 demarcating individual memory cells 106. However, in contrast with FIGS. 33A and 33B, the trench 3302 overlies the chimney seed structures 102. Further, the trench 3302 extends through the top electrode layer 110 but does not extend through the bottom electrode layer 108 and the ferroelectric layer 104. Instead, the trench 3302 stops at a top of the ferroelectric layer 104. In alternative embodiments, other suitable acts are performed.

Figure 45:
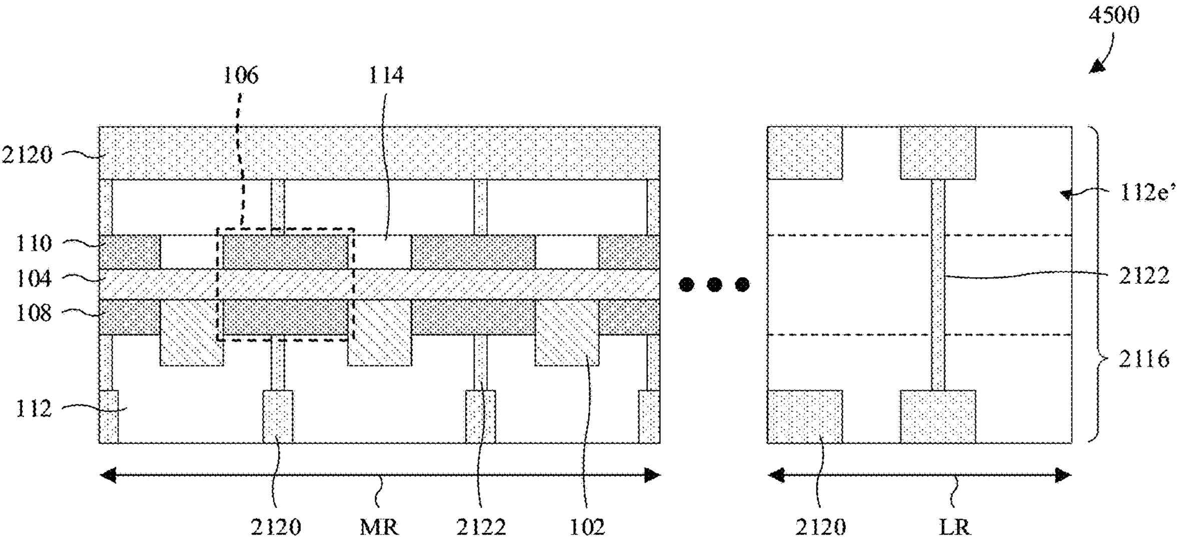

As illustrated by a cross-sectional view 4500 of FIG. 45, the acts described with regard to FIGS. 34 and 35 are performed. Such acts form the dielectric wall 114 in the trench 3302 (see, e.g., FIGS. 44A and 44B). Further, such acts complete the interconnect structure 2116 over the memory cells 106. In alternative embodiments, other suitable acts are performed.

While FIGS. 41, 42A and 42B, 43, 44A and 44B, and 45 are described with reference to a method, it will be appreciated that the structures shown in these figures are not limited to the method but rather may stand alone separate of the method. While FIGS. 41, 42A and 42B, 43, 44A and 44B, and 45 are described as a series of acts, it will be appreciated that the order of the acts may be altered in other embodiments. While FIGS. 41, 42A and 42B, 43, 44A and 44B, and 45 illustrate and describe as a specific set of acts, some acts that are illustrated and/or described may be omitted in other embodiments. Further, acts that are not illustrated and/or described may be included in other embodiments.

In some embodiments, the present disclosure provides a memory device, including: a bottom electrode layer; a ferroelectric layer overlying the bottom electrode layer; a top electrode layer overlying the ferroelectric layer, wherein the top electrode layer, the ferroelectric layer, and the bottom electrode layer form a plurality of memory cells; a dielectric wall extending through the top electrode layer and segmenting the top electrode layer into a plurality of top electrodes individual to the memory cells; and a chimney seed structure underlying the ferroelectric layer and extending through the bottom electrode layer from the ferroelectric layer.

In other embodiments, the present disclosure provides another memory device, including: a bottom electrode layer; a ferroelectric layer overlying the bottom electrode layer a top electrode layer overlying the ferroelectric layer; a dielectric wall extending through the top electrode layer to demarcate a plurality of memory cells in the top electrode layer, the ferroelectric layer, and the bottom electrode layer; and a first ferroelectric chimney and a second ferroelectric chimney on a bottom of the ferroelectric layer; wherein the first ferroelectric chimney and the second ferroelectric chimney have a first thickness, and wherein the ferroelectric layer has a second thickness less than the first thickness from the first ferroelectric chimney to the second ferroelectric chimney.

In yet other embodiments, the present disclosure provides a method for forming a memory device, the method including: depositing a bottom electrode layer over a substrate; patterning the bottom electrode layer to form an opening in the bottom electrode layer; forming a chimney seed structure filling the opening; depositing a ferroelectric layer overlying the bottom electrode layer and the chimney seed structure; depositing a top electrode layer overlying the ferroelectric layer; performing a laser anneal to the chimney seed structure, wherein the laser anneal results in a ferroelectric crystalline phase growing laterally outward from the chimney seed structure into the ferroelectric layer; and forming a plurality of memory cells in the bottom electrode layer, the ferroelectric layer, and the top electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:

depositing a bottom electrode layer over a substrate;

patterning the bottom electrode layer to form an opening in the bottom electrode layer;

forming a chimney seed structure filling the opening;

depositing a ferroelectric layer overlying the bottom electrode layer and the chimney seed structure;

depositing a top electrode layer overlying the ferroelectric layer;

performing a laser anneal to the chimney seed structure, wherein the laser anneal results in a ferroelectric crystalline phase growing laterally outward from the chimney seed structure into the ferroelectric layer; and forming a plurality of memory cells in the bottom electrode layer, the ferroelectric layer, and the top electrode layer, comprising:

patterning the top electrode layer to form a trench surrounding and demarcating the plurality of memory cells; and filling the trench with a dielectric material to form a dielectric wall.

2. The method according to claim 1, further comprising:

forming an intermetal dielectric (IMD) layer over the substrate, wherein the IMD layer is nitrogen doped at a top surface of the IMD layer, and wherein the patterning of the bottom electrode layer forms the opening extending into the top surface of the IMD layer.

3. The method according to claim 1, wherein the ferroelectric layer is deposited directly on the bottom electrode layer, and wherein the top electrode layer is deposited directly on the ferroelectric layer, and wherein one of the top electrode layer and the bottom electrode layer is semiconductive.

4. The method according to claim 1, further comprising:

depositing an interfacial layer overlying and directly on the ferroelectric layer, wherein the interfacial layer is dielectric, and wherein the top electrode layer is deposited overlying and directly on the interfacial layer.

5. The method according to claim 1, further comprising:

depositing an interfacial layer overlying and directly on the bottom electrode layer, wherein the interfacial layer is dielectric and lines the opening, and wherein the chimney seed structure is formed overlying and directly on the interfacial layer.

6. The method according to claim 1, wherein the patterning of the bottom electrode layer forms a plurality of openings, including the opening, in a plurality of rows and columns, and wherein a plurality of chimney seed structures are formed respectively filling the plurality of openings.

7. The method according to claim 1, wherein the trench extends through the ferroelectric layer and the bottom electrode layer.

8. A method, comprising:

depositing a bottom electrode layer over a substrate;

performing an etch into the bottom electrode layer to form a plurality of openings in a plurality of rows and a plurality of columns;

forming a plurality of ferroelectric structures in and respectively filling the plurality of openings, wherein the plurality of ferroelectric structures comprise a first ferroelectric structure and a second ferroelectric structure;

depositing a ferroelectric layer over the bottom electrode layer and the plurality of ferroelectric structures;

depositing a top electrode layer overlying the ferroelectric layer;

performing an anneal to grow a ferroelectric phase in the ferroelectric layer; and forming a plurality of memory cells in the bottom electrode layer, the ferroelectric layer, and the top electrode layer;

wherein the ferroelectric layer has a first region of ferroelectric phase growth and a second region of ferroelectric phase growth expanding outward respectively from the first and second ferroelectric structures during the anneal, and wherein the first and second regions are spaced from each other at a first time during the anneal and contact each other at a second time during the anneal that is after the first time.

9. The method according to claim 8, wherein the anneal comprises laser annealing with a laser beam directed at a ferroelectric structure of the plurality of ferroelectric structures.

10. The method according to claim 8, further comprising:

forming a conductive interconnect structure over the substrate and comprising a plurality of wires and a plurality of vias that are alternatingly stacked away from the substrate, wherein the bottom electrode layer is formed overlying and electrically coupled to the conductive interconnect structure.

11. The method according to claim 8, wherein the forming of the plurality of ferroelectric structures comprises:

depositing an additional ferroelectric layer overlying the bottom electrode layer and filling the plurality of openings; and performing a planarization into the additional ferroelectric layer to expose a top surface of the bottom electrode layer.

12. The method according to claim 8, wherein the forming of the plurality of memory cells comprises:

performing an additional etch into the top electrode layer to form a trench surrounding and demarcating the plurality of memory cells, wherein the trench is laterally offset from the plurality of ferroelectric structures.

13. The method according to claim 8, wherein the forming of the plurality of memory cells comprises:

performing an additional etch into the top electrode layer to form a trench surrounding and demarcating the plurality of memory cells, wherein the trench overlies and is spaced from the plurality of ferroelectric structures.

14. A method, comprising:

depositing a bottom electrode layer over a substrate;

performing an etch into the bottom electrode layer to form an opening in the bottom electrode layer;

depositing a ferroelectric layer overlying the bottom electrode layer and filling the opening;

performing a planarization into the ferroelectric layer to expose a top surface of the bottom electrode layer and to form a seed structure in the opening;

depositing an oxide layer overlying the bottom electrode layer and the seed structure;

depositing a top electrode layer overlying the oxide layer;

annealing the oxide layer to grow a crystalline phase in the oxide layer, wherein the crystalline phase grows outward from the seed structure; and forming a plurality of memory cells in the bottom electrode layer, the oxide layer, and the top electrode layer.

15. The method according to claim 14, wherein the seed structure and the oxide layer are ferroelectric after the annealing.

16. The method according to claim 14, wherein the forming of the plurality of memory cells comprises:

performing an additional etch into the top electrode layer to form a trench surrounding and demarcating the plurality of memory cells, wherein the trench overlies the seed structure and is separated from the seed structure by the oxide layer.

17. The method according to claim 14, wherein the forming of the plurality of memory cells comprises:

performing an additional etch into the top electrode layer to form a trench surrounding and demarcating the plurality of memory cells, wherein a bottom of the trench is recessed relative to a top surface of the seed structure.

18. The method according to claim 14, wherein the oxide layer has an elevated concentration of nitrogen relative to the seed structure.

19. The method according to claim 14, wherein the plurality of memory cells are formed in a memory region, which is laterally offset from a logic region, and wherein a concentration of the crystalline phase in the oxide layer is the same at the memory region and at the logic region before the annealing and is elevated in the memory region relative to the logic region after the annealing.

20. The method according to claim 14, further comprising:

forming an intermetal dielectric (IMD) layer over the substrate, wherein the bottom electrode layer is deposited over the IMD layer, and wherein the etch extends completely through the bottom electrode layer into the IMD layer.

* * * * *